United States Patent [19]

Dasgupta et al.

[11] 4,293,919
[45] Oct. 6, 1981

[54] LEVEL SENSITIVE SCAN DESIGN (LSSD) SYSTEM

[75] Inventors: Sumit Dasgupta, Wappingers Falls; Prabhakar Goel, Poughkeepsie, both of N.Y.; Thomas W. Williams, Longmont, Colo.

[73] Assignee: International Business Machines Corporation, Armonk, N.Y.

[21] Appl. No.: 66,130

[22] Filed: Aug. 13, 1979

[51] Int. Cl.³ .................. G06F 7/48; G06F 11/00; H03K 23/30
[52] U.S. Cl. ................................ 364/716; 307/221 R
[58] Field of Search ............... 364/716; 307/207, 203, 307/221 R

[56] References Cited

U.S. PATENT DOCUMENTS

| | | | |
|---|---|---|---|
| 3,761,695 | 9/1973 | Eichelberger | 371/25 |
| 3,783,254 | 1/1974 | Eichelberger | 364/716 |
| 3,784,907 | 1/1974 | Eichelberger | 371/62 X |
| 3,806,891 | 4/1974 | Eichelberger et al. | 307/221 R X |
| 4,063,080 | 12/1977 | Eichelberger et al. | 371/62 |
| 4,074,851 | 2/1978 | Eichelberger et al. | 371/25 |

OTHER PUBLICATIONS

Bottorff et al., "Test Generation for Large Logic Networks", *14th Design Auto. Conf. Proceedings*, Jun. 20–22, 1977, pp. 479–485.
Hsieh et al., "Delay Test Generation", *14th Design Auto. Conf. Proceeding*, Jun. 20–22, 1977, pp. 486–491.
Storey et al., "Delay Test Simulation", *14th Design Auto. Conf. Proceedings*, Jun. 20–22, 1977, pp. 492–494.
Correia et al., "Introduction to an LSI Test System", *14th Design Automation Conference Proceedings*, Jun. 20–22, 1977, New Orleans, Louisiana, pp. 460–461.
Eichelberger et al., "A Logic Design Structure for LSI Testability", *14th Design Auto. Conf. Proceedings*, Jun. 20–22, 1977, pp. 462–468.
Godoy et al., "Automatic Checking of Logic Design Structures for Compliance with Testability Ground Rules", *14th Design Auto. Conf. Proceedings*, Jun. 20–22, 1977, pp. 469–478.

*Primary Examiner*—David H. Malzahn
*Attorney, Agent, or Firm*—Wesley DeBruin

[57] ABSTRACT

One of the significant features of the invention, as in U.S. Pat. No. 3,783,254, is the implementation of shift register latches as basic building blocks in a logic organization and system with combinational logic networks which provide the excitation for the shift register latches. These shift register latches in the invention as well as in the patent contain a pair of latches where one is a "master" latch and another a "slave". The structure in the patent requires the "master" and "slave" latches to be part of the shift register for scan-in/scan-out. However, only the "master" may be set with data from the logic system surrounding it while the "slave" may only be set with data which previously resided in the related "master" latch. Thus, in those logic organizations where only the "master" latch output is required, the usefulness of the "slave" latch is limited to scan-in/scan-out. In the shift register latch of the invention, the "slave" latch must be set with the data that resided in the related "master" latch during scan-in/scan-out. However, in logic systems requiring the use of only one latch of the shift register latch, both "master" and "slave" latches can perform independent of the other; that is, each latch may be set with data from the logic system without any influence from the other latch in the same shift register latch. Similarly, both "master" and "slave" may feed different sections of the logic surrounding it.

3 Claims, 23 Drawing Figures

LEVEL SENSITIVE SCAN DESIGN (LSSD) SYSTEM

FIELD OF THE INVENTION

The invention relates to an improved Level Sensitive Scan Design (LSSD) System. More particularly, to an improved "Level Sensitive Logic System" of the type disclosed and claimed in U.S. Pat. No. 3,783,254 granted Jan. 1, 1974 to E. B. Eichelberger and of common assignee.

CROSS-REFERENCE TO RELATED PATENTS AND PUBLICATIONS

U.S. Pat. No. 4,063,080 entitled "Method of Propagation Delay Testing A Level Sensitive Embedded Array Logic System", filed June 30, 1976, granted Dec. 13, 1977 to E. B. Eichelberger, E. I. Muehldorf, R. G. Walther and T. W. Williams, and of common assignee.

U.S. Pat. No. 4,051,352 entitled "Level Sensitive Embedded Array Logic System", filed June 30, 1976, granted Sept. 27, 1977 to E. B. Eichelberger, E. I. Muehldorf, R. G. Walther and T. W. Williams, and of common assignee.

U.S. Pat. No. 4,006,492 entitled, "High Density Semiconductor Chip Organization" filed June 23, 1975, granted Feb. 1, 1977 to E. B. Eichelberger and G. J. Robbins, and of common assignee.

U.S. Pat. No. 4,051,353 entitled "Implementation of Level Sensitive Logic System Employing Accordion Shift Register Means", filed June 30, 1976, granted Sept. 27, 1977 to Hua-Tung Lee, and of common assignee.

U.S. Pat. No. 4,063,078 entitled "Clock Generation Network" filed June 30, 1976, granted Dec. 13, 1977 to E. B. Eichelberger and S. DasGupta, and of common assignee.

U.S. Pat. No. 3,783,254 entitled "Level Sensitive Logic System", field Oct. 16, 1972, granted Jan. 1, 1974 to Edward B. Eichelberger and of common assignee.

U.S. Pat. No. 3,761,695 entitled "Method of Level Sensitive Testing A Functional Logic System" filed Oct. 16, 1972 granted Sept. 25, 1973 to Edward B. Eichelberger and of common assignee.

U.S. Pat. No. 3,784,907 entitled "Method of Propagation Delay Testing A Functional Logic System" filed Oct. 16, 1972 granted Jan. 8, 1974 to Edward B. Eichelberger and of common assignee.

IBM Technical Disclosure Bulletin Publication entitled "Single Clock Shift Register Latch" by T. W. Williams, Vol. 16, No. 6, Novemeber 1973, page 1961. "Level Sensitive Scan Design Test Chips, Boards, System" by Neil C. Berglund, (IBM Corp. General Systems Division, Rochester, Minn.) electronics, Mar. 15, 1979.

BACKGROUND OF THE INVENTION

In times prior to the advent of large scale integration, the designer of computer logic has had complete flexibility in arranging logic circuitry to implement system and sub-system logic functions in central processing units, channels and control units employed in digital computing apparatus. A significant variety of design implementations has resulted from the exercise of this flexibility. Each of these implementations has its own special dependency on the ac characteristics of the individual circuits empolyed in the system.

The independence and flexibility characterizing the arrangements of the designer often led to unexpected system timing problems, complicated and complex problems in testing the circuitry, and a significant complexity and detail required for educating the field service personnel for such computing systems. However, it had the advantage of permitting the designer to use all techniques to obtain the best performance by employing the fewest number of circuits. The interface between the logic designer and the component manufacturer was reasonably well defined and the approach of the past could be supported in component manufacturing since the ac parameters such as rise time, fall time, individual circuit delay, etc., could rather readily be tested. With the advent of large scale integration, however, this well defined and reliably tested interface no longer exists. It has become impossible or impractical to test each circuit for all of the well known ac circuit parameters. As a result, it is necessary to partition and divide logic systems and sub-systems into functional units having characteristics that are substantially insensitive to these parameters. Large scale integration provides the ability for the logic designer as well as the component manufacturer to utilize the capacity for placing hundreds of circuits on a single chip of semiconductive material. Such an ability offers the potential for reducing power, increasing speed, and significantly reducing the cost of digital circuits.

Unfortunately, a number of serious considerations are involved before this potential can be achieved. For example, in a medium sized computing system having approximately 40,000 individual circuits, it has not been uncommon to effect 1500 or more engineering changes during the development period for the product. It is readily apparent that the implementation of such a significant number of engineering changes approaches the impossible when dealing with the lowest level modular unit of a computer which has hundreds of circuits contained within it.

Another area which must be considered as technology moves into the fabrication of large scale integrated functional units is the product testing required prior to its incorporation into a computing system. The subsequent diagnostic tests performed during field servicing as well as the simulation that is performed during design and manufacturing are factors for consideration in fabricating such functional units.

In the past, each individual circuit has been tested for the usual and normal ac and dc parameters. Access to the modular unit for applying the input test conditions and measuring the output responses has been achieved through a fixed number of input/output connection pins. However, in the realm of large scale integrated functional units, the same number of input/output pins are available, but there is considerably more circuitry.

Thus, in a typical module containing one hundred chips each having up to six hundred circuits with a three hundred circuit average, the module would contain at least 30,000 circits. Parametric testing of such a unit is not possible. If functional tests are attempted on such a unit, having the prior art logical design configurations, the extent of coverage of testing would be significantly low and the level of reliability for use in a computing system would also be significantly low. Accordingly, provision must be made for eliminating the dependencies of the past. Current logical systems must be avoided and new logic organizations must be utilized in computing systems if the advantages of large scale integration are to be optimized. Testing must be performed in a functional manner on these new logical units, be it at the chip level, the module level, or other level. This testing is accomplished by automatically generating tests that assure the proper operation of every logic element in the unit.

To solve the problems listed above, the logic system (Level Sensitive Scan Design) and methods of testing the logic system described in U.S. Pat. Nos. 3,783,254, 3,761,695 and 3,784,907 (fully identified earlier herein) were defined so as to be applicable to all levels of the hierarchy of modular units. The generalized logic systems described in the above patents have a single-sided delay dependency, avoid all race conditions and hazards and eliminate the normal and usual ac timing dependencies. The functional logical units are made solely dependent on the occurrence of the signals from plural system clock trains. This is accomplished by using clocked dc latches for all internal storage circuitry in the arithmetic/logical units of the computing system. This latch circuitry is functionally partitioned along with associated combinational logic networks and arranged in sets. The plural clock trains are synchronous but non-overlapping and independent. The sets of latch circuitry are coupled through combinational logic to other sets of latches that are controlled by other system clock trains or combinations of clock trains. One of the ways to accomplish this objective is to use a different system clock for each one of the sets of latch circuitry.

The logic system of the U.S. Pat. No. 3,783,254 incorporates another concept, aside from the single-sided delay dependency giving hazard and race-free operation. It provides for each latch circuit to include additional circuitry so that each latch functions as a shift register latch having input/output and shift controls that are independent of the system clocks and the system input/outputs. All of these shift register latches are coupled together to form one or more shift registers. Each has a single input, a single output and shift controls.

With this additional circuitry, all of the system clocks can be de-activated, isolating all of the latch circuits from one another, and permitting a scan-in/scan-out function to be performed. The effect is to reduce all of the sequential circuitry to combinational circuitry which is partitioned down to the level of multistage combinational networks. This permits automatic test generation to be performed for testing each circuit in the entire logical unit.

It has been found necessary to reduce sequential logic circuits effecitvely to combinational logic networks as the problem of automatic test pattern generation is more easily solved for the latter type of network. The concept of the above patent provides for the latches to be converted into shift register latches. When this is accomplished, the shift register latches are then employed to shift in any desired test pattern of binary ones and zeros where they are retained for use as inputs to the combinational networks. The results of the combinational logic are clocked into the latches and then shifted out for measurement and comparison to determine the functional response of the logical unit.

The functional testing of the logic system under test is carried out in two parts. The first part of the functional tests checks the operation of the shift register configured for scan-in/scan-out function. The second part of the functional tests checks the operation of the remainder of the logic system.

With all system clocks in an off condition, the shift function is checked for proper operation by scanning in the stimuli of a pattern of binary ones and zeros using the shift controls. A comparison is made of this scanned-in stimuli with the responses of the pattern propagated through the stages of the shift register. Any fault in the register may then be isolated.

The automatically generated stimuli of the test patterns are provided one at a time to the functional logical unit being measured. Each set of stimuli of a pattern is shifted into the register and also provided as input signals to the functional unit. The contents of the shift register latches are measured at the unit outputs against the expected responses of the particular test pattern, thereby obtaining an initial indication of the state of the storage circuits. The effect of scanning the test pattern into the shift register is to negate the past history of the sequential circuits to be combinational in nature.

In the test method, the stimuli supplied to the unit inputs as well as the unit generated inputs from the shift register latches propagate through the networks of combinational logic. One system clock is exercised gating the output from one logic network to the associated stages of the shift register. Employing the independent shift controls, the contents of the register are shifted out for comparison with the expected responses of the test pattern. By controlling the system clocks associated with predetermined logical networks, the performance of each of the networks in a functional logic unit may be ascertained. Repeating this procedure with additional test patterns from the automatic test generator provides a clear indication of the fault status of the unit.

To perform propagation delay testing, the logic system under test is set up to perform the dynamic ac measurements. The latch circuitry organized into sets is initialized. This is accomplished by shifting a test pattern into the latch circuits of the register using the scan access. Concurrent with the initialization of the latch circuitry, the test pattern is applied to the system inputs. The application of the test pattern to the system inputs and to the sets of latches involves the sensitizing of a selected path within the logic system under test. Such a path flows through a combinational circuit network and the effect is to condition the inputs to the individual circuits of the network so that when one of the primary inputs is changed, propagation of the change takes place through the particular sensitized path to a location for measurement. To effect a change, a primary input is altered. After a predetermined lapsed time folling the changing of the primary input, any change that has resulted at the output of the sensitized path of the combinational network is measured.

Generally, four types of sensitized paths must be considered for testing propagation delay. These include the path from a primary input through a combinational circuit network to a primary output. A second path is from a primary input through a combinational circuit network to a latch set which forms part of the shift register. A third path is from a latch set forming a part of a shift register through a combinational circuit network to a primary output and the fourth path is from one set of latches through a combinational circuit network to a second set of latches. A primary input as used in the context of testing is either a system input or a clock input provided at a particular time. The ability to shift test patterns into and out of the sets of latches arranged as a shift register using the independent scan access and controls coupled with the independence of the clock signals renders it possible to perform the dynamic testing of these types of paths for propagation delays.

Dependent on the particular path that has been sensitized for measurement of propagation delays, the measurement occurs either by direct observation or by exercising another clock train so as to gate the output of a combinational circuit network into a latch set. In this way, it may be shifted out using the scan access and controls for measurement. Thus, in those paths which run to a primary output, the measurement is performed directly. In those instances where the sensitized path runs to a latch set, the measurement is made by clocking the combinational circuit network into the set of latches, and then shifting out using the scan access and controls. In all instances, interrogation is made as to whether the output changed to a new value. If there had not been any change, then the propagation delay through the selected paths exceeds a predetermined value and the particular unit under test is rejected as being out of specification. On the other hand, if a change took place, an indication is provided that the propagation delay is within the particular specification and the unit is accepted.

In this manner, automatically generated test patterns are provided one at a time to the functional logic unit being tested for propagation delay. Each set of patterns is shifted into the register and also provided as input signals to the functional unit. By effecting a change in one of the system inputs or in one of the clock trains, a selected path is sensitized through at least a portion of the logical unit. Dependent on the portion selected, a measurement is made to determine if the requisite specification for propagation delays has been met. Repeating this procedure with a substantial number of test patterns from an automatic test generator, provides a clear indication of the propagation delays through the unit.

The use of these latches enables dc testing of the logic system to be performed. By controlling and measuring the maximum circuit delay through the combinational networks of the entire unit, an appreciation of the ac response for the unit is obtained. With such a system, the state of every latch in the logic system may be monitored on a single cycle basis by shifting out all the data in the latches to some sort of a display device. This may be accomplished without disturbing the state of the sub-system, if the data is also shifted back into the latches in the same order as it is shifted out.

The arrangement has the effect of eliminating the need for special test points in such a system and therefore enables a greater density of circuit packaging to be achieved. Another advantage for such a system is that it provides a simple standardized interface allowing greater flexibility in creating operator or maintenance consoles. The consoles are readily changeable without in any way changing the logic system. Diagnostic tests may be performed under the control of another processor or tester and, in addition, perform such functions as reset, initialization and error recording. One of the most significant advantages of this logic organization and system is that it enables marginal testing to be implemented by merely controlling the speed at which the system clocks operate. From this test data, it can be readily determined as to the speed of response of the functional unit and its possible area of future utilization.

One of the significant features of the Level Sensitive Scan Design System (LSSD) is the implementation of shift register latches as basic building blocks in a logic organization and system with combinational logic networks which provide the excitation for the shift register latches. Plural clock trains control groups of the shift register latches in the operation of the system. Independent accessing and controls are also provided for these latches for the independent scan-in/scan-out function to be performed.

SUMMARY OF THE INVENTION

As with the structured organization of U.S. Pat. No. 3,783,254, the logic systems of this invention are generalized and applicable to all levels of hierarchy of modular units. The logic system of this invention incorporates all of the features described for the structure in the patent. One of the significant features of the invention, as in the patent, is the implementation of shift register latches as basic building blocks in a logic organization and system with combinational logic networks which provide the excitation for the shift register latches. These shift register latches in the invention as well as in the patent contain a pair of latches where one is a "master" latch and another a "slave". The structure in the patent requires the "master" and "slave" latches to be part of the shift register for scan-in/scan-out. However, only the "master" may be set with data from the logic system surrounding it while the "slave" may only be set with data which previously resided in the related "master" latch. Thus, in those logic organizations where only the "master" latch output is required, the usefulness of the "slave" latch is limited to scan-in/scan-out. In the shift register latch of the invention, the "slave" latch must be set with the data that resided in the related "master" latch during scan-in/scan-out. However, in logic systems requiring the use of only one latch of the shift register latch, both "master" and "slave" latches can perform independent of the other; that is, each latch may be set with data from the logic system without any influence from the other latch in the same shift register latch. Similarly, both "master" and "slave" may feed different sections of the logic surrounding it.

The methods of testing described in U.S. Pat. Nos. 3,761,695 and 3,784,907 are fully incorporated in the method of testing of the logic system of this invention. These testing methods are incorporated in the description with all references to the logic system of this invention.

In the above cited methods of testing, the testing of the combinational logic networks is accomplished by capturing the output state of each such network into the "master" latch. Each "master" latch state is subsequently shifted to the corresponding "slave" latch by application of a shift clock. Thereafter, the slave latches are shifted out for observation.

In our invention, the testing methods allow for the states of combinational logic networks to be captured in either the group of "master" latches or the group of "slave" latches, but not both. If on a particular test the states are captured in the "master" latches, then the procedure followed is the same as in the aforecited patents. If instead the states are captured in the "slave" latches the slave latches can be immediately shifted out for observation.

DESCRIPTION OF THE PREFERRED EMBODIMENT

Figure 1:
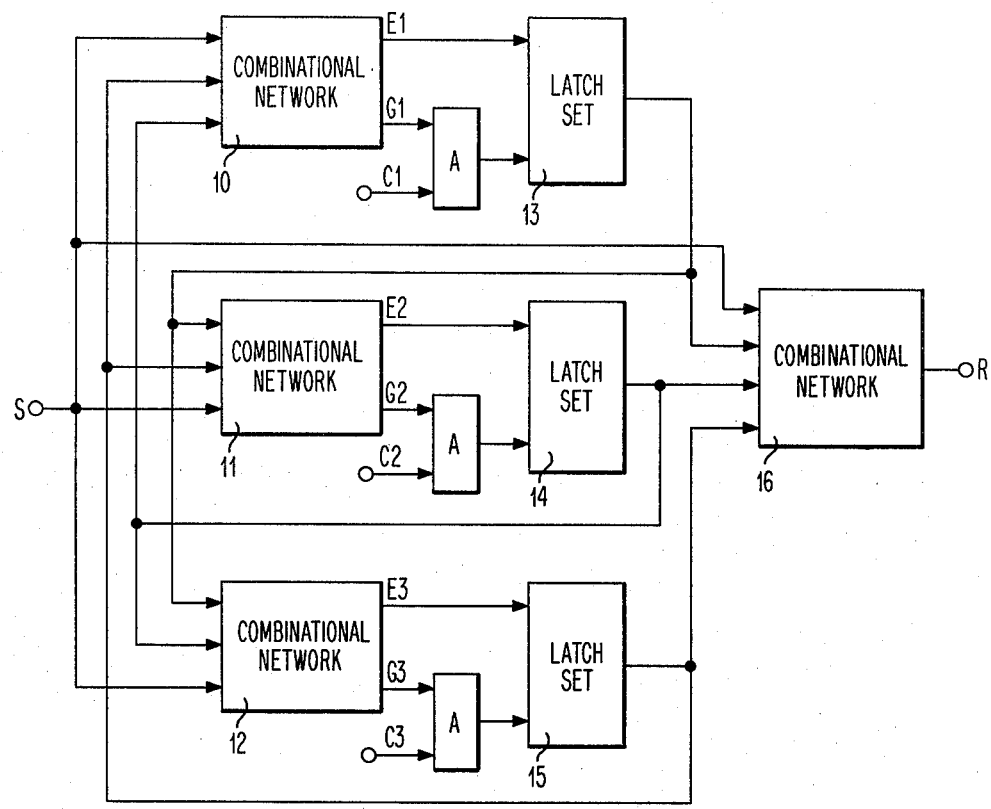
FIG. 1 is a schematic diagram of the organization of a generalized logic system embodying the principles of the invention.

The generalized and modular logic system of the invention has a common organization and structure similar to that in U.S. Pat. No. 3,783,254. It is applicable to any arithmetic or logical unit of a computing system, hereinafter referred to as an ALU. A system or subsystem in accordance with the invention would form all or a substantial functional part of a central processing unit, a channel or a control unit in the computing system. Such an organization and structure assists in large scale integrated chip and module testing, field diagnostics and technology upgrading. Almost all functions implementable by an arrangement of logic circuits can be implemented using this organization and structure. For economic reasons, pure storage functions, such as memory arrays, register arrays, etc., would not normally be implemented in this way. However, control logic associated with these storage functions could also be implemented in it. As will be apparent from the description which follows hereinafter, non-digital functions such as analog circuits and sense amplifiers may not be organized according to the principles of the invention.

The logic configuration of the invention is characterized by having a single-sided delay dependency similar to that in U.S. Pat No. 3,783,254. The logic organization employs the concept of configuring so that correct operation of the structure is not dependent on rise time, fall time or minimum delay of any individual circuit in a functional unit. The only dependency is that the total delays through a number of levels or stages of logic is less than some known value. Such a configuration is referred to as a level sensitive.

For purposes of definition, a logic system is level sensitive if, and only if, the steady state response to any allowed input state change is independent of the circuit and wire delays within the system. Also, if an input state change involves the changing of more than one input signal, then the response must be independent of the order in which they change.

It is readily apparent from this definition that the concept of level sensitive operation is dependent on having only allowed input changes. Thus, a level sensitive configuration includes some restriction on how the input signal changes occur. As will be described more fully hereinafter, these restrictions on input changes are applied almost exclusively to the system clocking signals. Other input signals such as data signals have virtually no restrictions on when they may occur.

The term "steady state response" refers to the final value of all internal storage elements such as flip flop or feedback loops. A level sensitive system is assumed to operate as a result of a sequence of allowed input changes with sufficient time lapse between changes to allow the system to stabilize in the new internal state. This time duration is normally assured by means of the system clock signal trains that control the dynamic operation of the logic configuration.

The logic organization of the invention, as in the above patent, also incorporates the concept of configuring all internal storage elements so that they may function as shift registers or portions of shift registers. To implement this concept, all storage within the logic organization is accomplished by utilizing latches that are free of hazards or race conditions, thereby obtaining logic systems that are insensitive to ac characteristics such as rise time, fall time and minimum circuit delay.

The latches are level sensitive. The system is driven by two or more non-overlapping clock signal trains that are independent of each other. Each of the signals in a train need have a duration sufficient only to set a latch. The excitation signal and the gating signal for any clocked latch are a combinational logic function of the system input signals and the output signals from latches that are controlled by other clock signal trains from the train providing an input to such clocked latch.

One way to accomplish this latter objective, to be described more fully hereinafter, is to have each such clocked latch controlled by exactly one of the system clock signals. When the gating signal and clock signal are both in an "on" or "up" condition, the clocked latch is set to the state determined by the excitation signal for that latch.

Finally, the logic organization of the invention allows fuller use of the shift register latches than is possible in the organization described in the above patent. As will be described more fully hereinafter, and unlike the above patent, both latches of a shift register latch set in the logic organization of the invention can function as independent latches as well as be connected together into a shift register for the purpose of scan-in/scan-out. This dual function of latches, unique to this invention, allows savings in the required number of shift register latch sets.

With a logic system organization according to these requirements, test patterns provided by an automatic test generator are supplied for accomplishing the propagation delay testing and/or the functional testing of the logic system of this invention according to the methods of U.S. Pat. Nos. 3,784,907 and 3,761,695, respectively. In the test generation system of FIG. 15, test patterns are provided to a unit under test 10. Such a unit is formed using the fabrication methods of large scale integration. It may be the lowest level unit of integration such as a semiconductor chip having hundreds of circuits contained within it or it may be a larger modular unit containing thousands of such circuits. In all instances, it must satisfy the requirements of single-sided delay dependency and scan-in/scan-out capability. A more complete description of such an organization is described more particularly hereinafter.

Test patterns supplied to unit under test 10 include both stimuli and the responses expected from the particular unit when acted on by a particular stimuli. The patterns are generated by an automatic test system which is included as a part of a general purpose digital computer. Such a computing system which may be employed to accomplish this objective is a System 370 Mod 168. Such a system would include back up storage of eight megabyte.

The organization of the system includes an automatic test generator 11 having a library of assumed faults 12 stored within it. It also includes the control cards 13 including all parameters necessary for generating the test patterns. The control cards 13 contain the procedures for operation and determine what routines and sub-routines must be employed for accomplishing the testing on the particular unit under test. The assumed faults 12 are an algorithm for each type of circuit arrangement or network that may be tested. To determine the particular patterns to be generated and the paths to be sensitized, the logic description of the particular unit under test is provided at 14 to automatic test generator 11. Logic description 14 consists of the physical design of the particular unit and is employed as a basis for determining the particular test and the possible failures that may occur.

Automatic test generator 11 provides the logic patterns for the assumed faults 12 of the specific unit under test as defined by its logic description 14. These logic patterns are provided to a compiler 15 in the system which also accepts specifications 16 from the particular technology employed in the unit under test. These specifications 16 consist of the values of voltages and currents that must be employed in that technology for the binary ones and zeros of the logic pattern. Compiler 15 provides technology patterns of binary ones and zeros at specific voltages and currents to test compiler and operation code test generator 17. Compiler and generator 17 provides the particular patterns that are applied to unit under test 10.

As already indicated, the test patterns include both the stimuli applied to the unit as well as the response expected. Test patterns are supplied directly to unit under test 10. Using the method of the invention, the unit is tested and an accept indication is provided at 18 or a reject indication at 19 when the measurement of the test is compared with the expected response. The reject indication may also be supplied as a part of the test generaation system to a cause of failure predictor 20, which also receives from test compiler and operation code test generator 17, test data to predict failure operation. This aspect of the test generation system is employed in diagnostic type testing. Cause of failure predictor 20 then provides at 21 the particular failure prediction.

All of the apparatus and program controls necessary for generating the test patterns and for selecting and sensitizing paths through the circuitry in performing the tests are similar to the established techniques generating fault oriented dc tests which are well known in the art. For example, the programs necessary to develop the test patterns for performing combinational tests on unit under test 10 are described in a paper entitled "Algorithms for Detection of Faults in Logic Circuits" by W. G. Bouricius, et al. which was published in Research Report RC 3117 by the IBM Thomas J. Watson Research Center on Oct. 19, 1970. An algorithm for the computation of tests for failures is described in "Diagnosis of Automata Failures: A Calculus and a Method" by J. Paul Roth in the IBM Journal of Research and Development, July 1966. These papers describe how to develop programmed algorithms for test generation and test evaluation. These include the generation of the assumed fault data necessary for the automatic test generation system. It is to be understood that the generation of the tests for this invention is similar to the difficulty of generating a combinational dc test. Each test is defined by a combinational function as opposed to a sequential function. Thus, each possible test is determined by one of the $2^n$ combinations of the n binary values of the system inputs to the functional logic unit and the internal inputs from the sequential logic circuits of the unit.

A generalized logic organization and structure incorporating these concepts is shown in FIG. 1. The configuration is formed of a plurality of combinational logic networks 10, 11, 12, arranged in parallel. Each network is coupled into a set of latches 13, 14, 15, respectively. Effectively then, the logic system is partitioned into a plurality of parts each of which is composed of a combinational network and a set of latches. Although three such partitions are shown, it is to be understood that any number more or less than the number shown may be arranged in parallel in accordance with the invention. The system also includes an additional combinational network 16 for accepting the latch set output signals and for generating system output signals designated as a set of such signals, R. Network 16 is shown as responding to input signal set S as well as the indications from latch sets 13, 14, 15. It is to be understood that the system response R may be any logical function of the latch set outputs and the set of input signals.

Each of the combinational networks 10, 11, 12 is a multiple input, multiple output, logic network. It includes any number of levels or stages of combinational circuits which may take the form of conventional semiconductor logic circuits. Although the networks in most instances in such a system are complex and include a number of stages of logic, it is to be understood, as will be described more fully hereinafter, that the networks may be simplex or trivial and consist only of conductors from one set of latches to another.

Each network is responsive to any unique input combination of signals to provide a unique output combination of signals. The output signals such as E1, E2, E3 are actually sets of output signals so that the symbol E1 stands for e11, e12 . . . e1N. Similarly, the symbols G1, G2 and G3 refer to sets of gating signals that may be provided by each of the combinational networks, respectively. The input signals provided to the combinational networks are the external input signals indicated as a set S of such signals and sets of feedback signals from the combinational networks and latch sets. It is to be understood throughout the description of this invention that the term "set" shall mean a single item or a substantial plurality of such items.

It is a necessary requirement of this generalized structure and its testing that two or more independent clock signal trains be employed to control the clocking of the signals in the unit. As already stated, a latch or latch set controlled by one clock signal train cannot be coupled back through combinational logic to other latches that are controlled by the same clock signal train. Thus, the output from latch set 13 cannot be coupled back into combinational network 10, as latch set 13 is responsive to clock train C1. However, this latch set can be coupled to combinational networks 11 and 12, both of which are responsive to different clock trains.

One way of implementing this requirement is to provide a separate clock for each partition, as shown in FIG. 1. Thus, clock train C1 is coupled into latch set 13, clock train C2 into latch set 14 and clock train C3 into latch set 15. The manner in which each latch set is controlled by exactly one of these clock signal trains is for each controlling clock signal $C_i$ to be associated with a latch set $L_{ij}$ receiving two other signals; an excitation signal $E_{ij}$ and possibly a gating signal $G_{ij}$. These three signals control the latch so that when both the gating signal and the clock signal are in an "up" state or binary one condition, the latch is set to the value of the excitation signal. When either the clock signal or the gating signal is a binary zero or in a "down" state, the latch cannot change state. It is also to be understood that the clocking may be accomplished by having the clock signal trains act directly on the respective latch sets without utilizing the sets of gating signals G1, G2, G3 and the intermediary AND gates.

Figure 2:
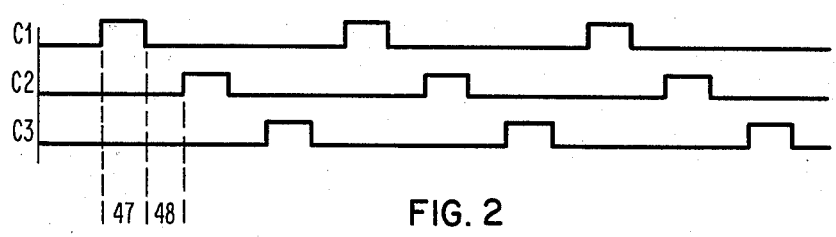
FIG. 2 is a timing diagram of the system clocking employed with the logic system of FIG. 1.

The operation of the logical system is determined by the clock signal trains. With reference to FIG. 2, with the rise of C1 in time frame 47, both C2 and C3 are zero and the inputs and outputs of combinational network 10 are stable. If it is assumed that the external set of inputs S are also not changing, clock signal C1 is then gated through to the latches of set 13 if the corresponding set of the gating signals G1 are at an "up" or binary one level. The latches of set 13 are set to the value of their set of excitation signals E1. Thus, some of the latches in latch set 13 may be changed during the time that C1 is in an "up" state. The duration of time frame 47 need only be long enough for the latches to be set. The signal changes in the latches immediately propagate through combinational networks 11, 12 by means of the feedback connections. They also propagate through combinational network 16.

Before clock signal C2 can change to an "up" or binary one condition, the output signals from latch set 13 have to complete propagation through combinational networks 11, 12. This duration between clock signals C1 and C2 occurs in time frame 48 which must be at least as long as the propagation time through network 11.

When clock signal C2 is changed from a "down" condition to an "up" condition, the process is continued with the latches in set 14 storing the excitation signals from network 11. In similar manner, clock signal C3 is changed to an "up" condition to latch set 15. Thus, for proper and correct operation of the logic system, it is necessary that the clock signals have a duration long enough to set the latches and a time interval between signals of successive clock trains that is sufficient to allow all latch changes to finish propagating through the combinational networks activated by the feedback connections. Such operation meets the requirement for a level sensitive system and assures a minimum dependency on ac circuit parameters.

Information flows into the level sensitive logic system through the set of input signals S. These input signals interact within the logic system by controlling them using the clock signals that are synchronized with the logic system. The particular clock time in which the signals change is controlled and then the input signal is restricted to the appropriate combinational networks. For example, with reference to FIG. 1, if the set of signals S always changes at clock time C1, set S may be employed as an input to combinational network 11 or 12 but not as an input to network 10.

If the external input signals are ascynchronous in that they change state at any time, then the manner of handling these signals within the logic system is accomplished by synchronizing them using latches. A latch receives as inputs one of the excitation signals as well as the particular clock signal. As the latch cannot change when the clock signal is at a "down" or binary zero condition, the output of the latch only changes during the period when the clock pulse is in an "up" or binary one condition. Even if the set of input signals S changes during the time when the clock signal is in the "up" condition, no operational problem occurs. If the latch almost changes, a spike output might appear from the latch during the time when the clock pulse is in the "up" condition. However, this does not create any problems since the output of this latch is employed only during another clock time.

External output signals, such as the set of responses R, normally do not cause any problem unless there are critical restrictions regarding the timing of the output. For consistency and simplicity, most output signals are probably some function of the latch outputs that are all controlled by the same clock signal. Thus, they remain at a given value for a given number of clock cycles.

It is apparent from FIGS. 1 and 2 that the proper operation of the logic system is dependent only on the propagation time or delay through the combinational networks 10, 11, 12. This delay (time frame 48) must be less than the corresponding time lapse between successive clock signals. If it is not, then the sets of latches cannot be set. This final timing dependency is eliminated by providing the capability of system retry at a slower clock speed. The use of longer clock pulses with more lapsed time between clock signals results in successful retry, even if the error was caused by a timing problem in the system. This approach provides improved system reliability, reduces no trouble found service calls in the field, and reduces the exposure to incomplete ac testing of highly dense logic chips.

A logic system having a single-sided delay dependency has the advantage of permitting the system to be modeled in slower speed functional unit logic that is readily changeable during developmental stages of the technology of implementation. The transition from unit logic to large scale integrated logic is then made with the only exposure being the maximum speed at which the chip successfully operates. If the circuit delays were different in the highly integrated version than anticipated, it would mean solely that the system would have to be run at a slower speed. It thus, provides the capability for marginal testing for timing. For example, a worst case logic pattern is circulated in the system while the clock speed is slowly increased. Once the failing clock speed is established, either the clock is set for reliable operation or the failing unit is replaced with one that operates reliably at the rate of speed. It has been emphasized that one of the significant objectives in such a generalized logic system as shown in FIG. 1, is to obtain a system that is insensitive to ac characteristics. To accomplish this, the storage elements within such a system are level sensitive devices that do not have any hazard or race conditions. Circuits that meet this requirement are generally classified as clocked dc latches. A clocked dc latch contains two types of inputs: data inputs and clock inputs. When the clock inputs are all in some state for example, a binary zero state, the data inputs cannot change the state of the latch. However, when a clock input to a latch is in the other state, that is, a binary one state, the data inputs to that latch control the state of the latch in a dc manner.

Figure 3:
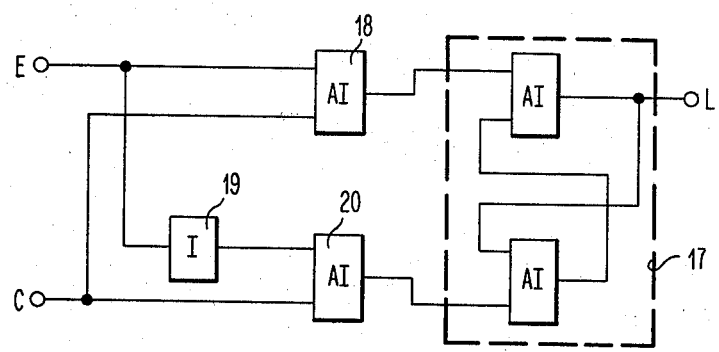
FIG. 3 is a block diagram of one form of a clocked dc latch implemented in AND Invert gates for use in the logic system of FIG. 1.
Figure 4:
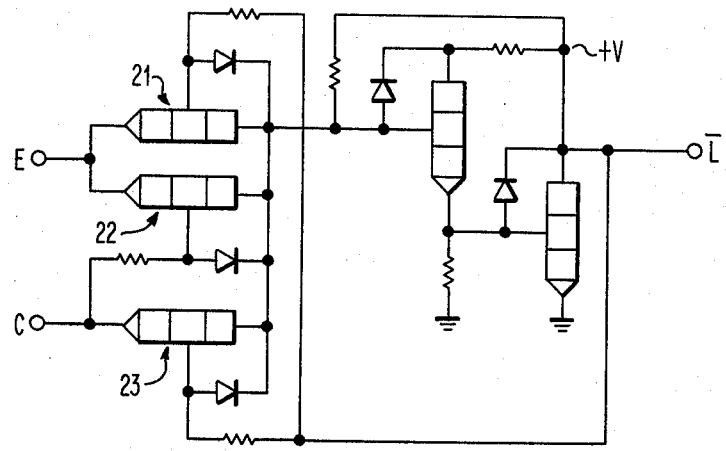
FIG. 4 is a circuit diagram of a latch performing the inverse of the same function as the one shown in FIG. 3.

One such latch of the dc clocked type is the polarity hold latch implemented in FIG. 3 in AND Invert gates, and in FIG. 4 in semiconductor logic circuitry. In FIG. 3, the storing portion of the latch is indicated at 17. FIG. 3 employs AND Invert gates 18, 20 and inverter 19. The equivalent tansistor circuitry in FIG. 4 includes the transistor inverters 21, 22, 23 arranged in combinational logic circuits with transistors 21 and 23 included in the feedback circuits for the storing circuitry.

The polarity hold latch has input signals E and C and a single output indicated as a L. In operation, when clock signal C is at a binary zero level, the latch cannot change state. However, when C is at a binary one level, the internal state of the latch is set to the value of the excitation input E.

Figure 5:
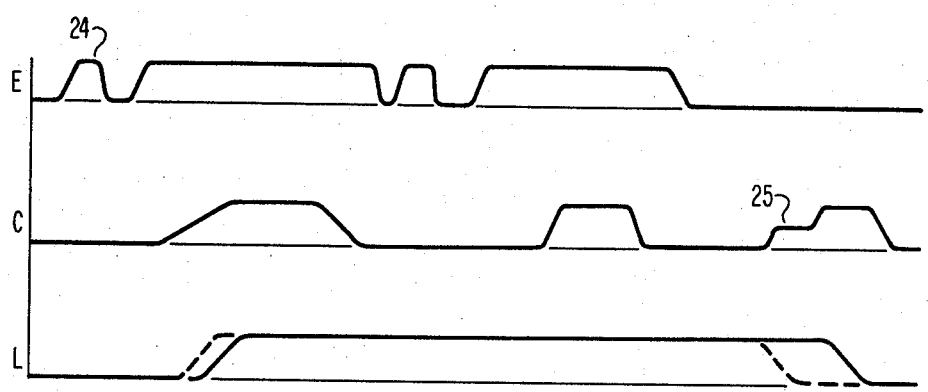
FIG. 5 is a timing diagram for the latch of FIG. 3.

With reference to FIG. 5, under normal operating conditions clock signal C is at a binary zero level (for purposes of description, the lower of the two voltage levels) during the time that the excitation signal E may change. Maintaining signal C in the binary zero conditions prevents the change in excitation signal E from immediately altering the internal state of the latch. The clock signal normally occurs (binary one level) after the excitation signal has become stable at either a binary one or a binary zero. The latch is set to the new value of the excitation signal at the time the clock signal occurs. The correct changing of the latch is therefore not dependent on the rise time or the fall time of the clock signal, but is only dependent on the clock signal being a binary one for a period equal to or greater than the time required for the signal to propagate through the latch and stabilize.

The signal pattern of FIG. 5 indicates how spurious changes in the excitation signal do not cause the latch to change state incorrectly. Thus, the spurious change at 24 in excitation signal E does not cause a change in the state of the latch as indicated by the output signal characteristic L. In addition, poorly shaped clock signals such as at 25 do not result in an incorrect change in the latch. These characteristics of the polarity hold latch are employed in the generalized structure for the logic system of FIG. 1.

Figure 6:
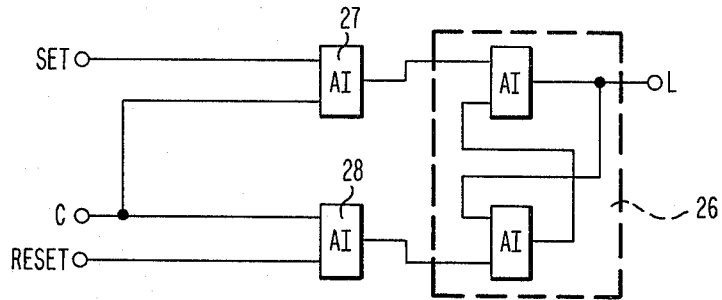
FIG. 6 is a block diagram of another clocked dc latch which may be employed in the logic system of FIG. 1.

Referring now to FIG. 6, there is shown another latch circuit employable as a sequential circuit in a level sensitive logic system. This latch is a closed set-reset latch in which the latching portion is indicated at 26. It receives its inputs from the AND Invert logic circuits 27, 28 which are coupled, respectively, to set and reset inputs and to a clocking signal train at C. The output signal indicative of the latch state is provided at L.

It is also a feature of the generalized logic system of this invention, as well as a requirement for the testing methods to be used to provide the ability to monitor dynamically the state of all internal storage elements. This ability eliminates the need for special test points, it simplifies all phases of manual debugging, and provides a standard interface for operator and maintenance consoles. To achieve this ability, there is provided with each latch in each latch set of the system, circuitry to allow the latch to operate as one position of a shift register with shift controls independent of the system clocks, and an input/output capacity independent of the system input/output. This circuit configuration is referred to as a shift register latch. All of these shift register latches within a given chip, module, etc., are interconnected into one or more shift registers. Each of the shift registers has an input and output and shift controls available at the terminals of the package.

By converting the clocked dc latches into shift register latches, the advantages of shift register latches are present. These include the general capability of stopping the system clock, and shifting out the status of all latches and/or shifting in new or original values into each latch. This capability is referred to as scan-in/scan-out or log-in/log-out. In the testing of the functional unit, dc testing is reduced from sequential testing to combinational testing which is substantially easier and more effective. Propagation delay testing is performed on sensitized paths through the combinational networks with the sequential networks effectively reduced to combinational networks. For propagation delay testing the well-defined delay dependencies, the scan-in/scan-out capability provides the basis for efficient, economical, and effective ac tests.

Heretofore, the circuits on a semiconductor chip have been sufficiently simple that considerable ac and dc testing could be performed to assure proper device and circuit operation. Subsequent testing at the module or card levels then concentrated on proper dc operation. Such testing verified that the circuits were correctly interconnected and had not been adversely affected by any of the steps in the fabrication processes. However, with the advent of large scale integration where a chip contains as many as 300 to 500 circuits, detailed ac testing is no longer possible and dc testing is extremely difficult due to the complexity of the functional unit under test and the significant change in the circuit to pin ratios on the chip.

As is well known in the art, the problem of automatically generating test patterns for combinational logic networks is relatively simpler than the generation of test patterns for complicated sequential logic circuits. Accordingly, it is necessary to render the sequential logic circuits such as the internal storage circuit of the generalized logic system to a form which permits the same type of test pattern generation to be employed as that used for combinational networks. This is accomplished by including additional circuitry for selectively converting the clocked dc latches into shift register latches.

Figure 7:
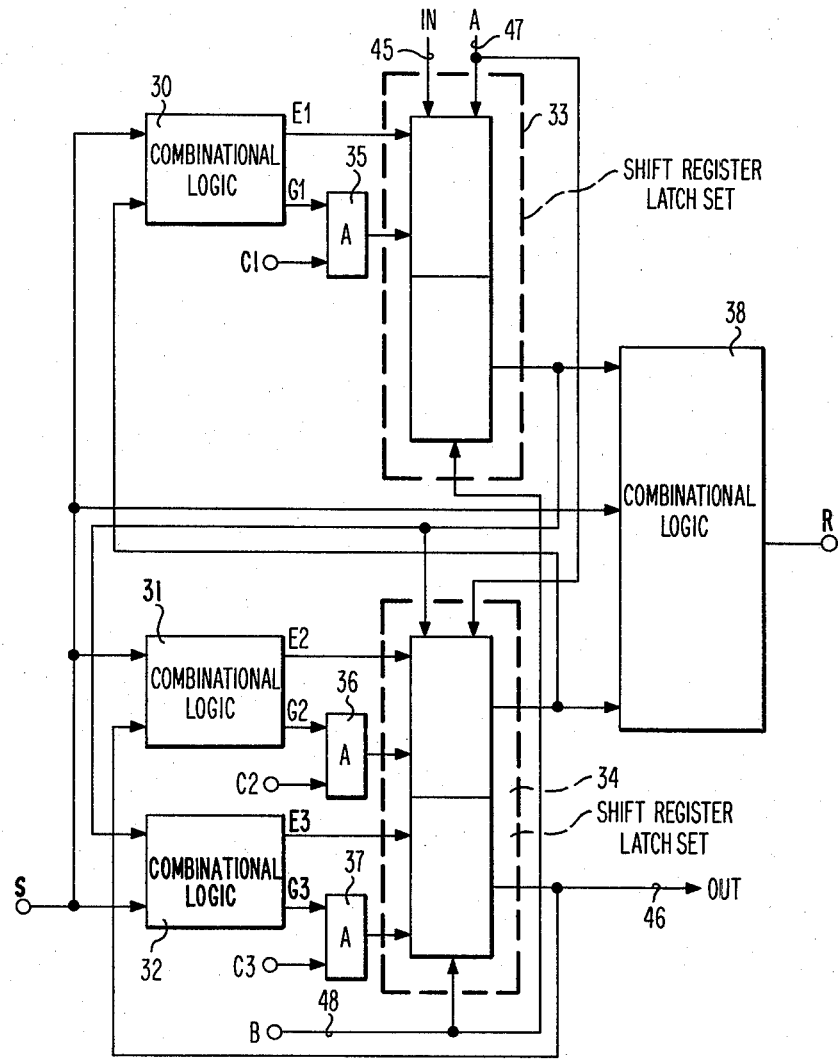
FIG. 7 is a schematic diagram of the organization of a generalized logic system in accordance with the invention and having provision for accomplishing scan-in/scan-out of the system.

Referring to FIG. 7, a logic system with three clock signals and two sets of register latches is shown. Combinational networks 30, 31, 32 are of the same type and nature as those described in connection with FIG. 1. They respond to sets of input signals S as well as to the latch back signals provided by sets of latches 33, 34. The combinational networks 30, 31, 32 each provides a set of excitation signals E1, E2, E3 and a set of gating signals G1, G2, G3. Through AND gates 35, 36, 37 system clocks C1, C2, C3 are gated to the latch sets 33, 34, respectively.

Latch sets 33, 34 differ from those of FIG. 1 in that they are connected as shift register latches. Latch set 33 is shown in symbolic form in FIG. 8A as including two distinct latching or storing circuits 37, 38. Latch set 34 in FIG. 7 is shown in symbolic form in FIG. 8B as including two distinct latching or storing circuits 39, 40.

Figure 8A:
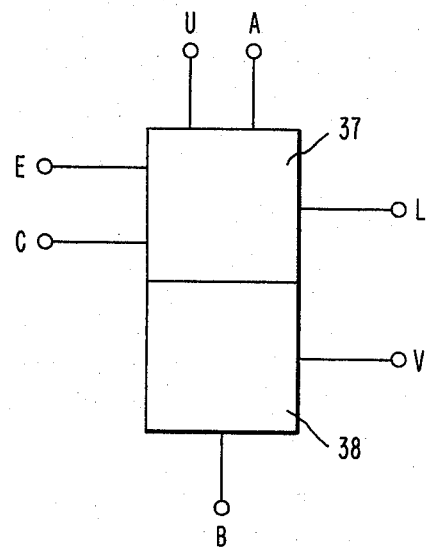
FIGS. 8A and 8B are symbolic representations of latch configurations to be employed in the generalized structure of FIG. 7.

Latch 37 in FIG. 8A consists of two parts, one part being the same as the latch circuits employed in the latch sets of FIG. 1 and as shown in FIG. 3. The other part of this latch consists of the additional circuits which along with latch 38 creates a shift register latch set necessary to build a shift register. With reference to FIG. 8A, latch 37 has two sets of inputs, one set consisting of an excitation input E and clock signal train input C both of which may be driven from the system logic. The other set of inputs consists of an excitation input U and clock signal train input A, both of which are needed for the latch to be part of a shift register. The output of latch 37 is marked L. Latch 38 has a clock signal train input B to set data from latch 37 into itself.

Figure 9A:
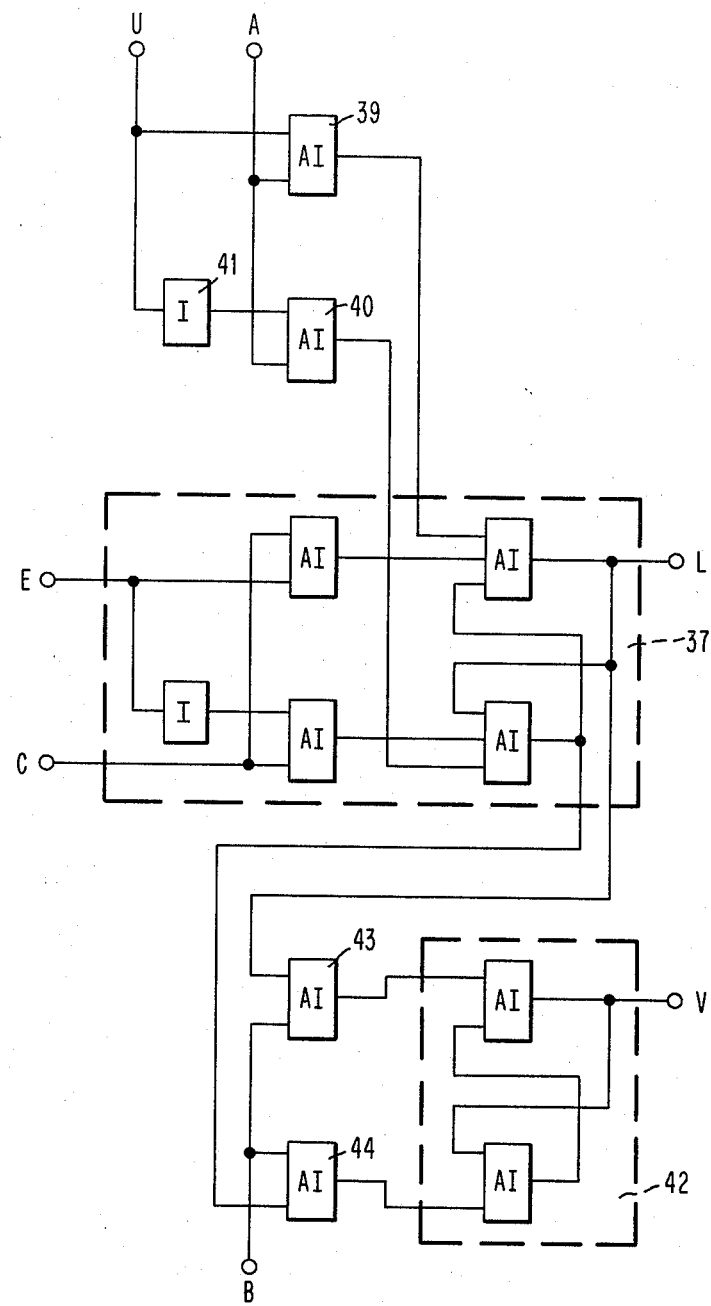
FIGS. 9A and 9B are block diagrams of clocked dc latches employed in the structure of FIG. 7 having provisions for scan-in/scan-out.

An implementation of the shift register latch in FIG. 8A using AND-Invert gates is shown in FIG. 9A. Indicated in dotted line form is latch 37 which is the same as the latch of FIG. 3. AND-Invert gates 39, 40 and inverter circuit 41 allows latch 37 to receive data from input U under control from the first shift clock input A during shifting. AND-Invert gates 43, 44 allows data from latch 37 to be set into the second latch 42 under control from the second shift clock input B during shifting. Output of latch 42 is denoted by reference character V.

Figure 8B:
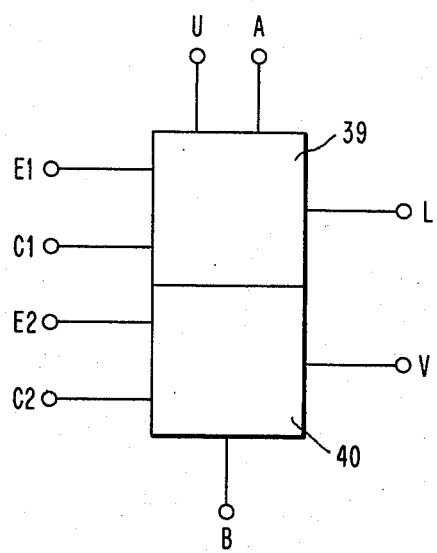

Latches 39 and 40 in FIG. 8B constitute the second type of shift register latch and is essential to this invention. Latch 39 consists of two parts with functions identical to that of latch 37 in FIG. 8A. Latch 40 in FIG. 8B performs two separate functions. Excitation input E2, coupled with clock signal train input C2, allows data from system logic to be set into latch 40. On the other hand, clock signal train input B allows data from latch 39 to be set into latch 40 so that the two can perform together as a shift register latch in a shift register.

Figure 9B:
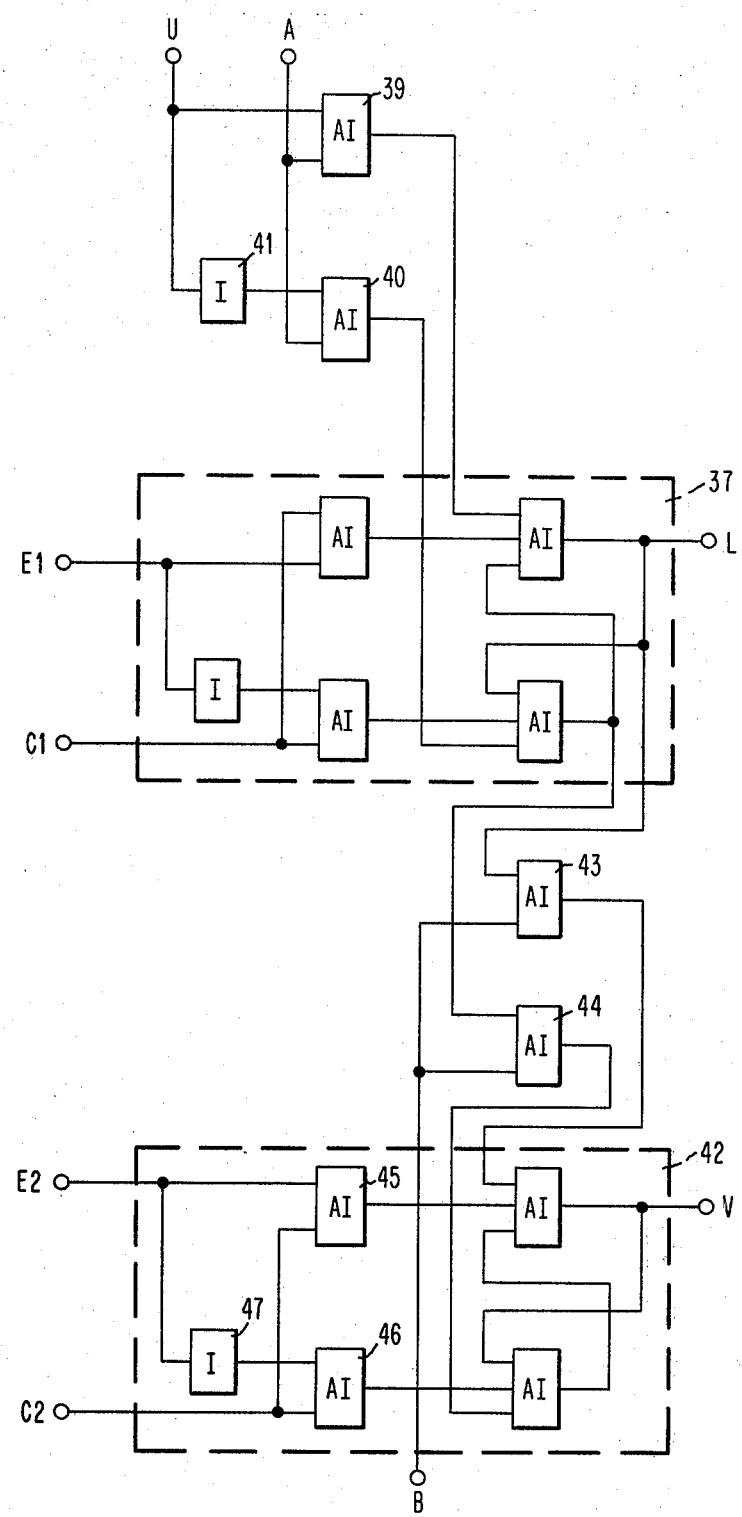
Figure 10:
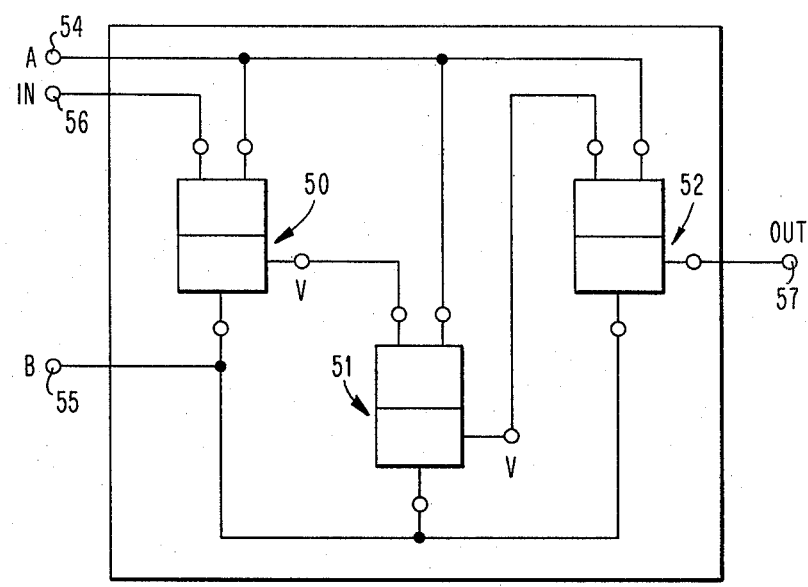
FIG. 10 is a symbolic illustration of the manner in which a plurality of the latches of FIGS. 8A and 8B are interconnected on a single semiconductor chip device.
Figure 11:
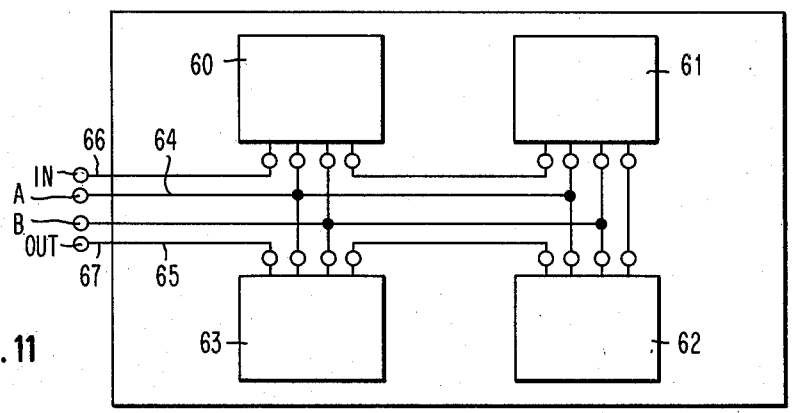
FIG. 11 is a symbolic illustration of the manner in which a plurality of such chip configurations as shown in FIG. 10 are interconnected on a module.
Figure 14:
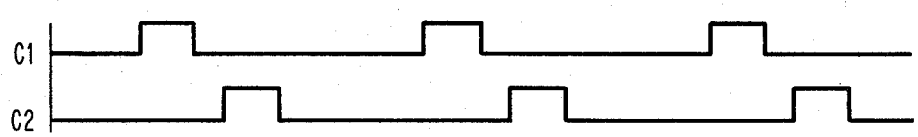
FIG. 14 is a timing diagram for the clock trains of the organization of FIG. 13.

An implementation of the second shift register latch in FIG. 8B using AND-Invert gates is shown in FIG. 9B. Indicated in dotted line form is latch 37 which is the same as the latch of FIG. 3. AND-Invert gates 39, 40 and inverter circuit 41 allows latch 37 to receive data from input U under control of the first shift clock input A during shifting. Also indicated in dotted line form is latch 42 which is the same as the latch in FIG. 3. AND-Invert gates 45, 46 and inverter circuit 47 allows latch 42 to be set with data from system logic via the excitation input E2 and clock train signal input C2. On the other hand, AND-Invert gates 43 and 44 allow data to be set from latch 37 during the shifting operation. Thus, this second latch in this shift register latch, unlike that in the shift register latch of FIG. 8A and in U.S. Pat. No. 3,783,254, has a dual role—as a latch for system logic as well as a latch for shift register operation. Note that the shift registers built with these shift register latches are used to shift in any desired pattern of ones and zeros for application to the system logic or for shifting out any pattern of ones and zeros that are fed to the shift register latches from the system logic.

Referring again to FIG. 7, each of the latch sets 33, 34 includes a plurality of the circuits shown in FIG. 9A and/or 9B. The circuits are sequentially connected together such that the U input of FIG. 9A or 9B would be the input line 45 of FIG. 7. The A shift clock is applied to the first latch (for example, circuit 37 in FIGS. 9A, 9B) of all of the latches of the sets. Similarly, the B shift clock is applied to the second latch (for example, circuit 42 in FIGS. 9A, 9B) of the latch sets. The V output from circuit 42 of FIG. 9A or 9B would be coupled as the input to the next succeeding latch of the set until the last such latch of the entire register when this output would be the equivalent of the output line 46 from the arrangement of FIG. 7. The shift register latches are therefore interconnected with an input, an output and two shift clocks into a shift register.

Figure 12:
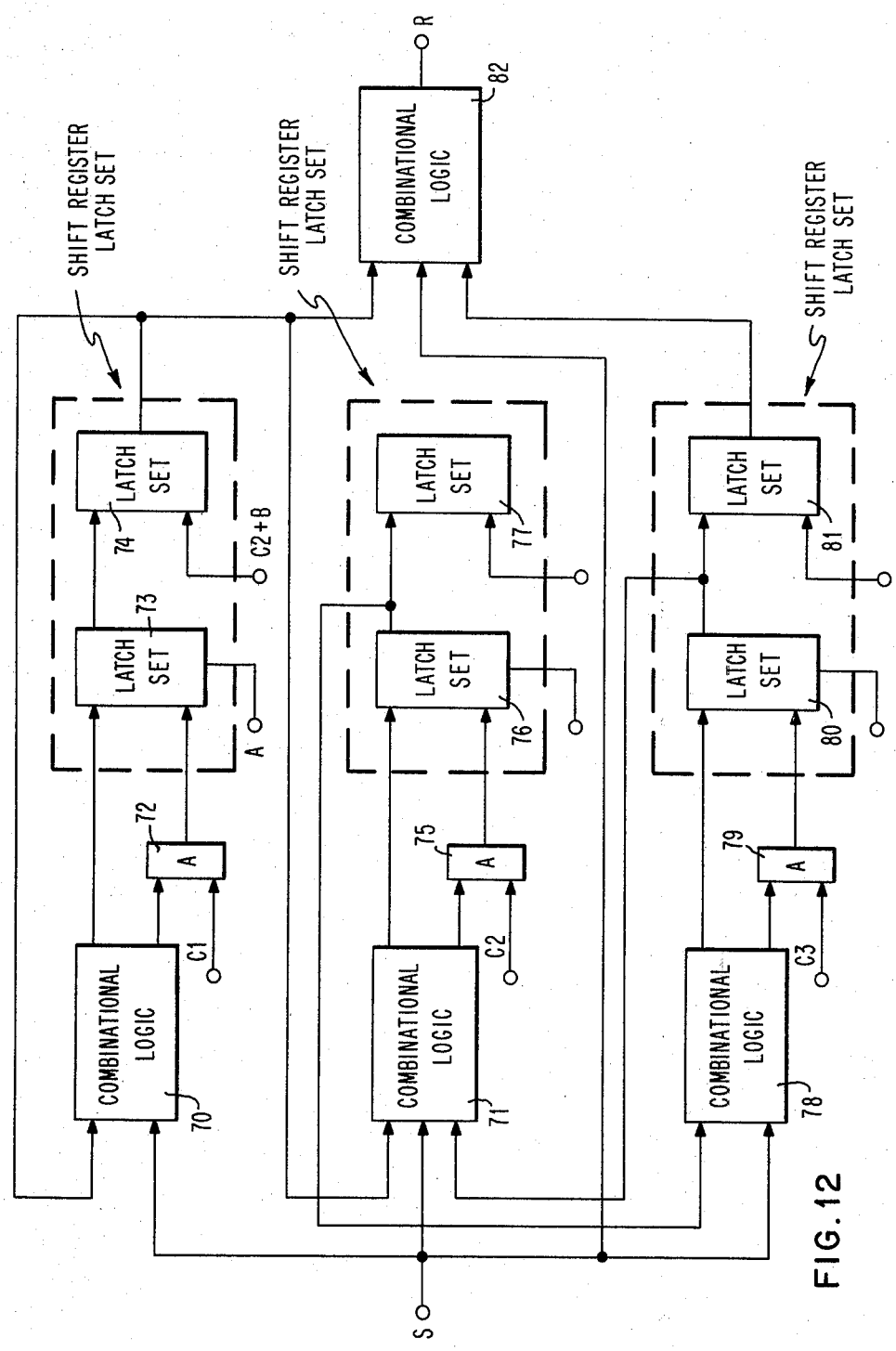
FIG. 12 is a schematic diagram of the organization of a generalized logic system having the modified form utilized in accomplishing the principles of the prior art defined in U.S. Pat No. 3,783,254.

FIG. 12 shows one method of designing in a Level Sensitive Logic System where system outputs from a Shift Register Latch are taken from the first latch which is also the one to receive data from the system logic. The second latch in such a shift register latch is used only for the operation of the shift register. Shift register latch sets comprising latch sets 76, 77 and 80, 81 respectively are examples where the second latch is unused in system logic. On the other hand, shift register latch set comprising latch sets 73, 74 has both latches used for system logic.

Figure 13:
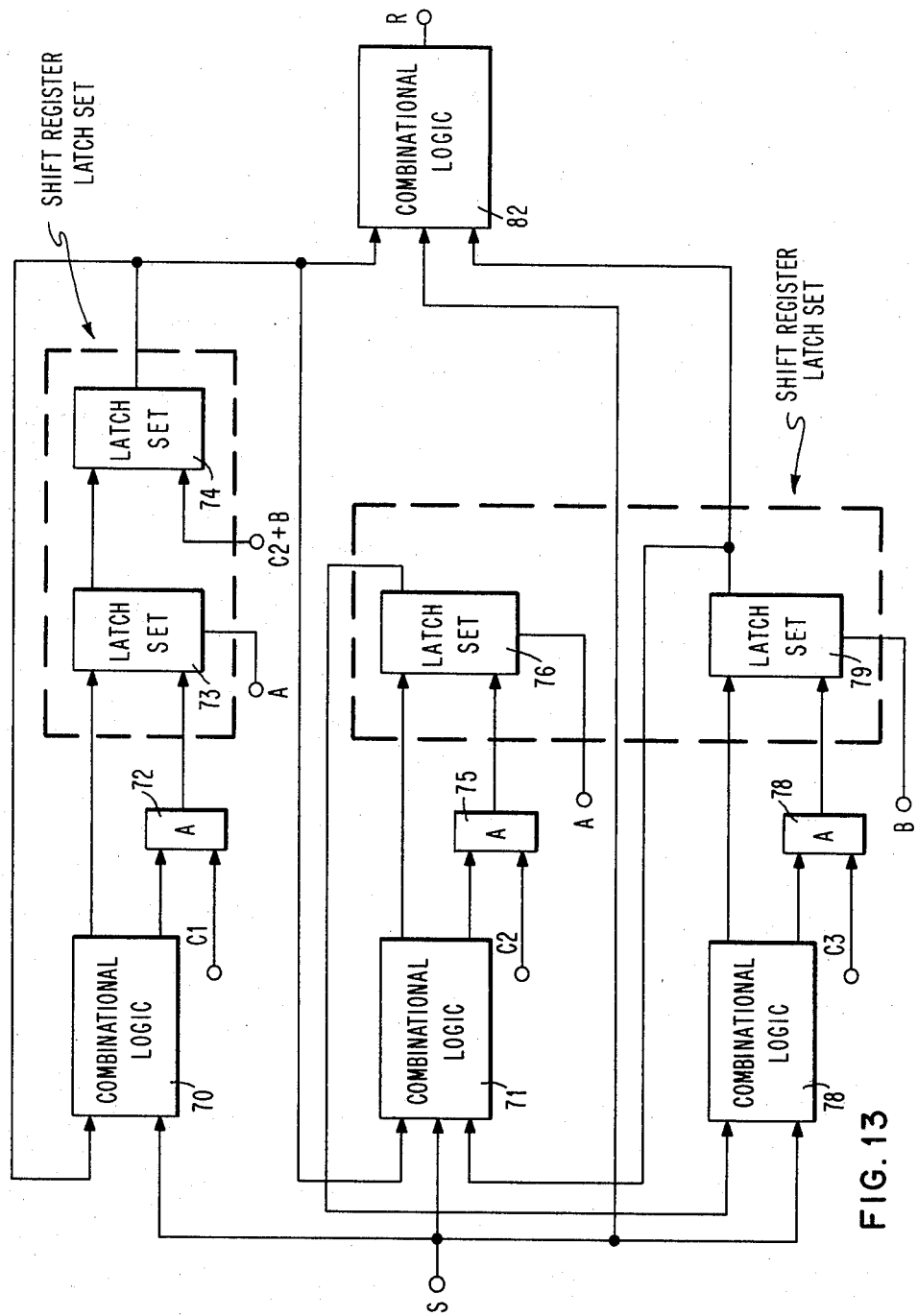
FIG. 13 is a schematic diagram of the organization of the generalized logic system of FIG. 12 but having the modified form utilized in accomplishing the principles of the invention.

FIG. 13 shows a more optimum version of the network of FIG. 12. It uses the shift register latch set of FIG. 8B to reduce the number of latches that are used purely for testing. This in no way affects the operation of the shift register during testing. From the standpoint of system logic, latch sets 76, 79 in FIG. 13 have replaced shift register latch sets comprising latch sets 76, 77 and 80, 81 respectively in FIG. 12. At the same time, latch sets 76, 79 in FIG. 13 combine to form a shift register latch set of the kind shown in FIG. 8B which is a key feature of this invention. So, latch sets 76, 79 in FIG. 13 operate as independent system latches for system logic and as part of a shift register latch set during testing.

Figure 15:
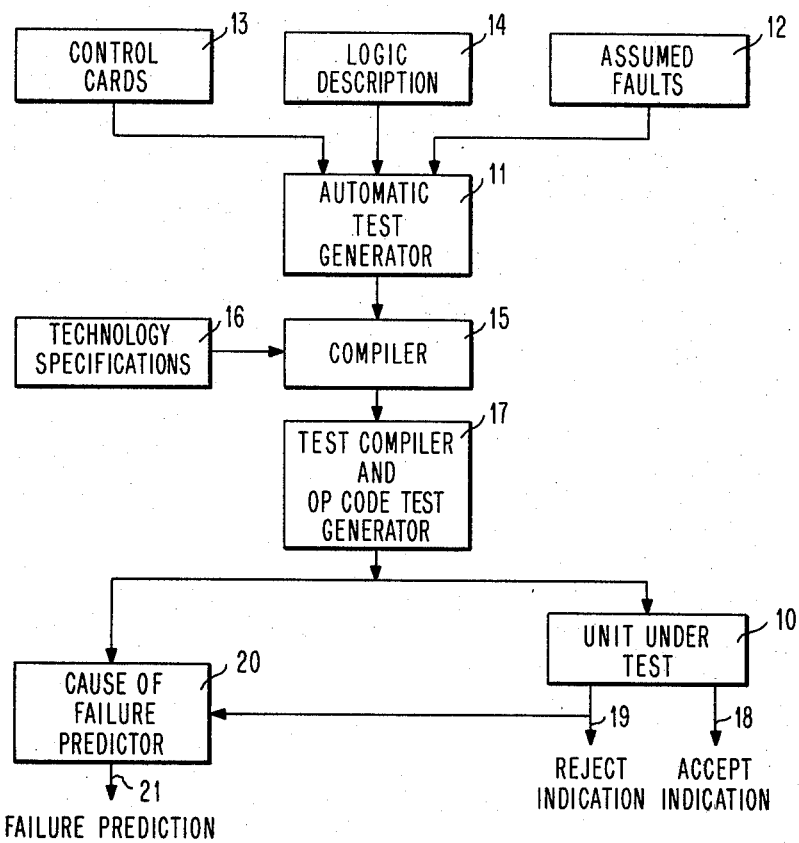
FIG. 15 is a block diagram of a testing method which may be employed in carrying out the functional testing method of the invention.
Figure 16B:
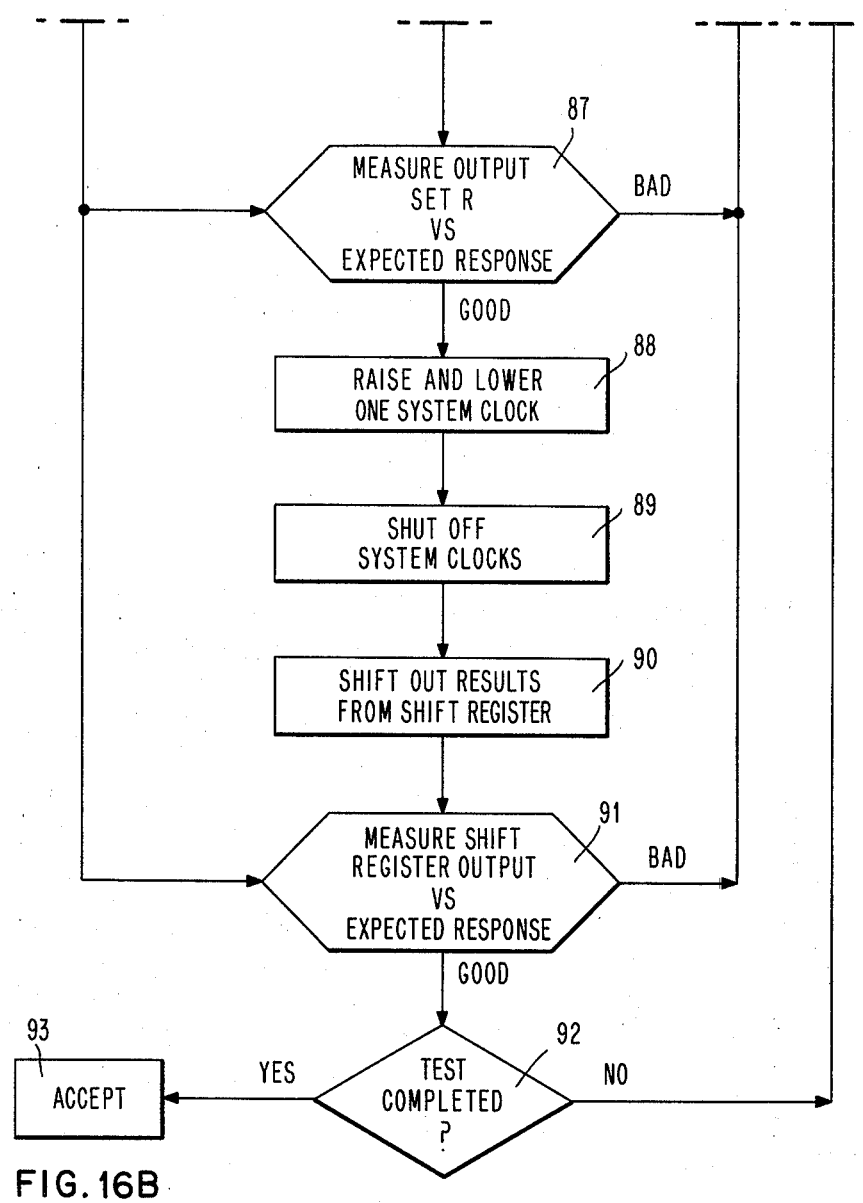
FIG. 16, a composite of FIGS. 16A and 16B, is a flow diagram involved in the functional testing method of the invention.
Figure 16A:
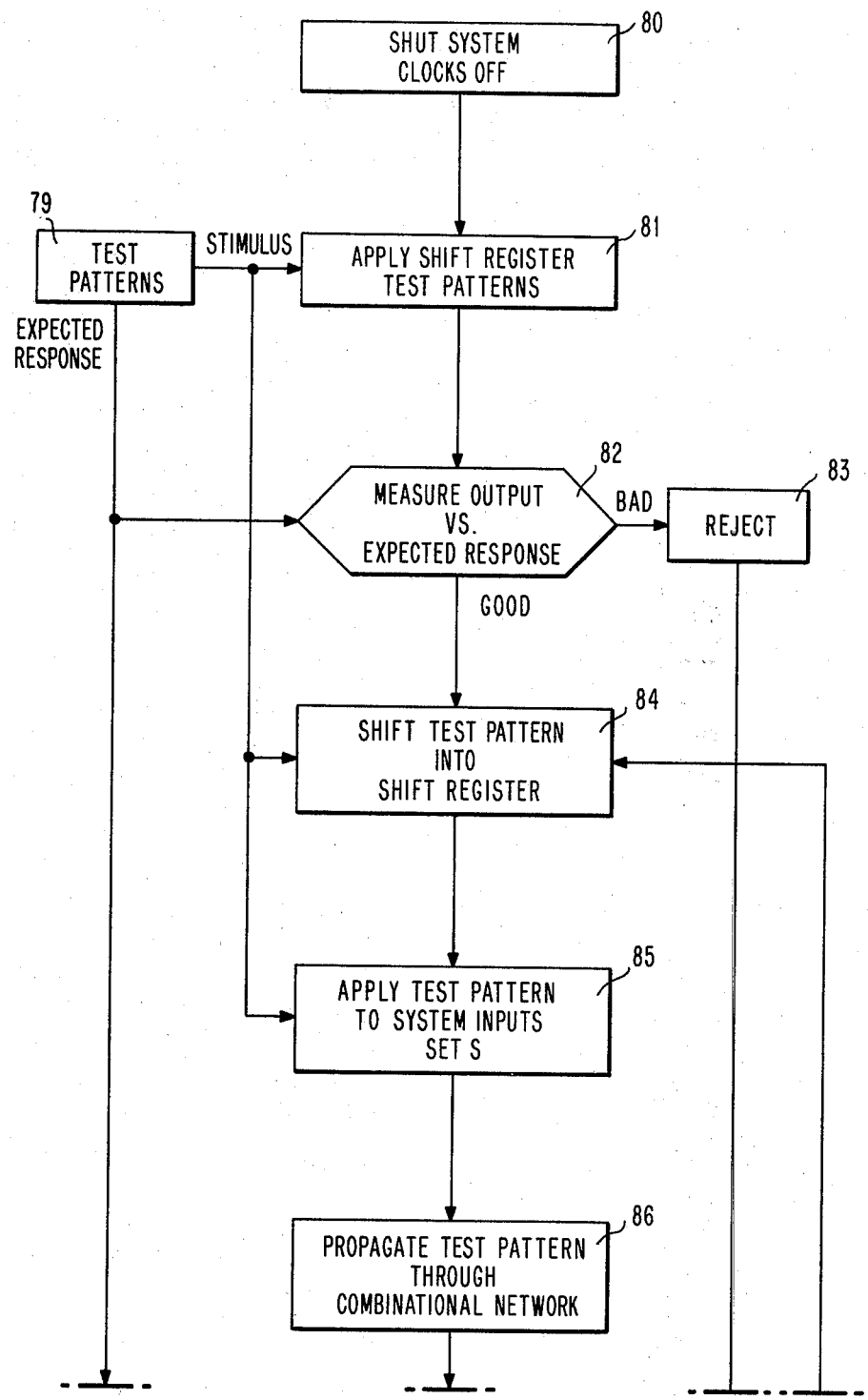

With the requirements of single-sided delay dependency and a scan-in/scan-out capability as described in connection with FIG. 7, test patterns from the test compiler and operation code test generator 17 of FIG. 15 may be provided to unit under test 10 for carrying out functional testing of the logic system described in this invention. With the system clocks in the off state as in block 80 of FIG. 16, the shift register formed of shift register latch sets 33, 34 of FIG. 7 is first tested. Test patterns 79 from compiler and generator 17 are applied on input line 45 sequentially to the latches of sets 33 and 34 as in block 81. The effect of having the system clocks in the off state is to isolate the shift register from the rest of the circuitry. This control of the system clocks is exercised at the input/output connections for the particular modular unit under test. The stimulus part of the test patterns consists of a pattern of binary ones and zeros. After being applied to latch set 33, they are shifted through latch set 34 to output line 46. The shifting is accomplished under the control of shift clocks A and B on lines 47, 48, respectively. As is evident from FIGS. 9A and 9B, shift clock A acts on the first latch 37 and shift clock B on the second latch 42 of the shift register latch. The output provided on line 46 is measured against the expected response from the test patterns 79. This measurement is performed in block 82. The purpose of this test is to assure that the shift register performs as required. If the measurement indicates that the shift register is bad, the unit under test is rejected at 83. On the other hand, if the measurement is good, the actual level sensitive testing of the circuitry of the unit is performed.

Figure 17:
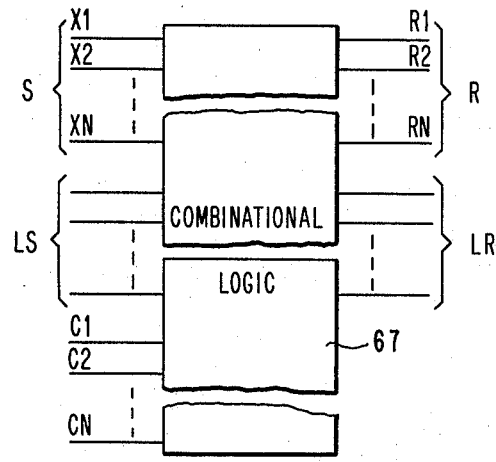
FIG. 17 is a diagram indicating how the test generator of FIG. 15 views a combinational logic network of a functional unit when performing the functional testing method of this invention.

In the next step of the testing method of the invention in block 84, stimulus in the form of a particular pattern is provided on input line 45 to the shift register and is shifted into the latches of the register formed by the sets 33, 34. The purpose of this is to initialize the states of the circuits in the shift register to negate the effects of any prior history for the sequential circuits of the unit under test. Effectively, then, the automatic test generation system of FIG. 15 sees the circuit of FIG. 17. It is a combinational logic block 67 having the set of real primary inputs S made up of the sub-sets X1, X2 ... Xn and real primary output set R formed of R1, R2 ... Rn. In addition, through the feedback connections from the latch sets to the combinational networks 30, 31, and 32, effectively the pseudo inputs set Ls is made up of the responses from the test pattern shifted into the shift register. In addition, pseudo outputs LR are provided. All of the operations of the combinational logic block 67 are performed under the control of the system clock inputs C1, C2 ... Cn. The testing of the functional logic unit which is actually formed of both combinational logic networks and sequential circuits is effectively reduced to the testing of a combinational logic configuration by having the ability to scan-in and scan-out test patterns and also to independently operate on the various networks of the configuration by means of the independent clock inputs C1, C2 ... Cn.

With the pseudo inputs test pattern in the various stages of the shift register, the same test pattern at 85 is applied at the system input set S. This pattern applied at set S propagates through combinational networks 30, 31, 32 in FIG. 7 as in block 86. The set of inputs is measured against the expected response from the particular test pattern applied to the shift register. If a bad indication is obtained, the unit under test is rejected. However, if a good indication is obtained, one of the system clocks is exercised by raising it for the required duration and then lowering it as in block 88. For example, if clock C1 is exercised, then the set of excitation inputs E1 is shifted into latch set 33. The clock control can be exercised directly by acting on the latch set or as shown in FIG. 7 in conjunction with the set of gating signals G1 through AND gate 35.

With clock C1 in an "on" condition for the period of time necessary to set the various latches in latch set 33 and then lowered to an "off" condition, the system clocks are then all set to an "off" condition as in block 89. The indications stored in latch set 33 are then shifted out on line 46. The output from the shift register provided at line 46 is measured versus the expected response for that test pattern (block 91). Rejection of the unit under test at 83 occurs if the measurement indicates a fault in the unit under test. If the measurement indicates that the unit is good, interrogation is made at 92 as to whether the test is complete for that unit. If it is not complete, the process is repeated by applying the same or a different pattern to the shift register as in block 84. As a practical matter, hundreds and possibly thousands of such patterns are applied to a particular unit under test in order to exercise all of the circuits within the unit and to assure a lack of faulty operation so that it is reasonably expected that the unit would perform the function for which it was intended in an actual logic system use in a computer. If all of the tests are completed on a particular unit, it is accepted at 93.

The methods of testing the logic structure described in this invention are different from the methods of U.S. Pat. Nos. 3,761,695 and 3,784,907 in that it is necessary to restrict each test to either exercise the clocks associated with the "master" latches (37 in FIGS. 9A, 9B) or the clocks associated with the slave latches (42 in FIGS. 9A, 9B). If the test is such that it exercises only the clocks of the "master" latches, then the data to be observed is contained in the "master" latches. In order to observe the data it is necessary to set the "slave" latches to the states of the corresponding "master" latches—before the scan-out can be accomplished from the shift register latch sets. This is accomplished by applying the shift B clock once at the logic system inputs and then following up with the scan-out procedure. If instead, the test is such that it exercises only the clocks of the "slave" latches then the states to be observed are already in the "slave" latches and the scan-out procedure may be directly employed to observe the desired states.

With the requirements of single-sided delay dependency and a scan-in/scan-out capability as described in connection with FIG. 7, test patterns from the test compiler and operation code test generator 17 of FIG. 15 may be provided to unit under test 10 for carrying out propagation delay testing. Generally, there are four paths through such a generalized logic system having primary inputs and primary outputs that must be tested for propagation delays. Two of these paths terminate at the primary outputs and the other two, in a set of latches.

With reference to FIG. 7, one such path is from the set S of system inputs through combinational network 38 to the set R of system responses. A second path is from the system inputs through a combinational network to a set of latches, such as from S through combinational network 30 to latch set 33. A third path is from a latch set, such as 33, through a combinational network, such as 38, to system responses R. The fourth path is from one latch set to a second latch set. Thus, the output of latch set 33 is coupled back through combinational network 32 to the latch set 34.

Figure 18:
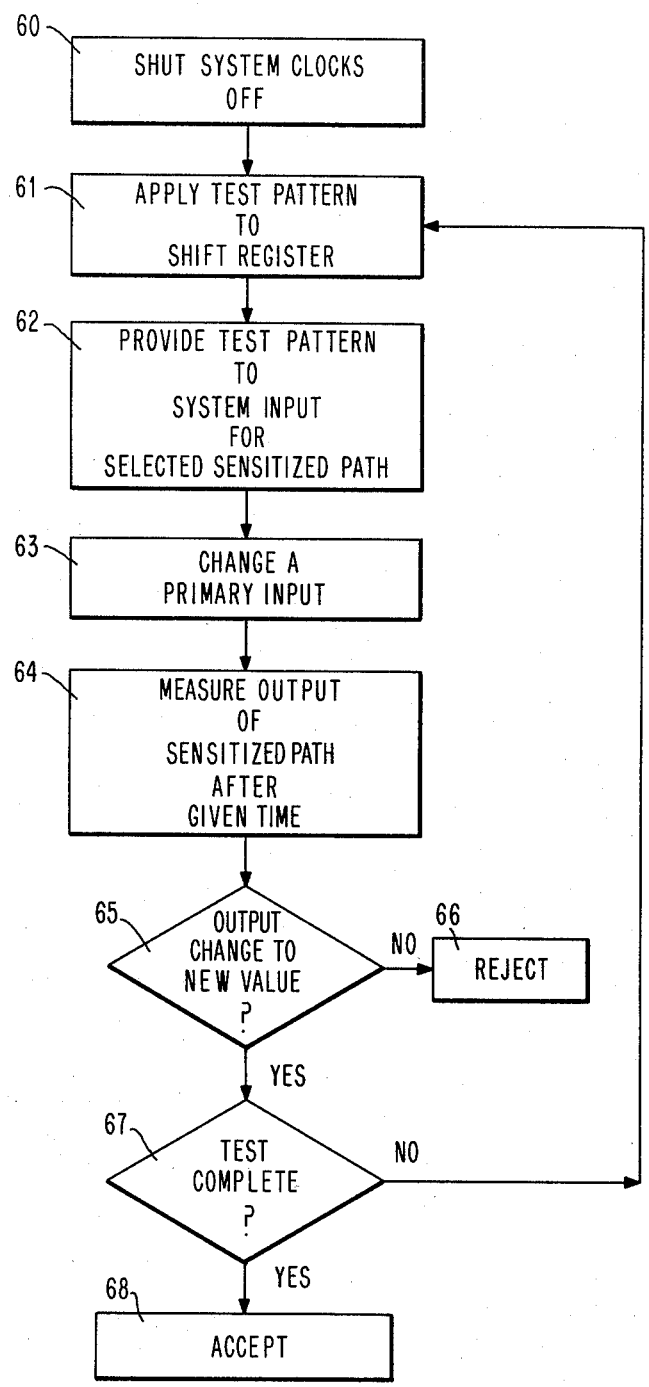
FIG. 18 is a flow diagram of the steps involved in carrying out the method of propagation delay testing.

To test for propagation delays in any one of these paths or through any circuits serially connected in one of these paths, the testing method provides for the system clocks C1, C2, C3 of FIG. 7 to be in an "off" state as indicated at block 60 of FIG. 18. A particular path as determined by the test generator system of FIG. 15 is selected for sensitization. A test pattern is scanned into the shift register formed of latch sets 33, 34 on input line 45 and under the control of shift clocks A and B, as provided in block 61. The effect of shifting in the test pattern is to initialize the states of all of the latches in the sets 33, 34. Substantially concurrently with the initialization of the latch states in the shift register, the test pattern is provided at the system inputs S for the particular selected sensitized path of the logic system under test (block 62).

In its generalized form, the propagation delay testing method provides for a primary input to be changed (block 63). This input is directly connected to and affects the selected sensitized path. A primary input is understood to be one of the inputs provided as a system input or one of the clock trains dependent on the particular path that is under test. After a given period of time has elapsed that is related to an acceptable propagation delay through the selected sensitized path, the output of this sensitized path is measured as in block 64. If this measurement indicates that the output did not change to a new value in accordance with interrogation of block 65, the unit is rejected (block 66).

Similarly, if a change in the output of the sensitized path was measured during the interrogation of block 65, interrogation is then made as to whether the testing for the functional logic unit is complete (block 67). As a practical matter, many hundreds and thousands of such tests are performed to determine the propagation delay characteristics for the unit. If the tests are not completed, the method continues as in block 61. If the tests are completed, the unit is accepted at block 68 indicating that the particular propagation delay characteristics set by the automatic test generation system have been met.

Figure 19:
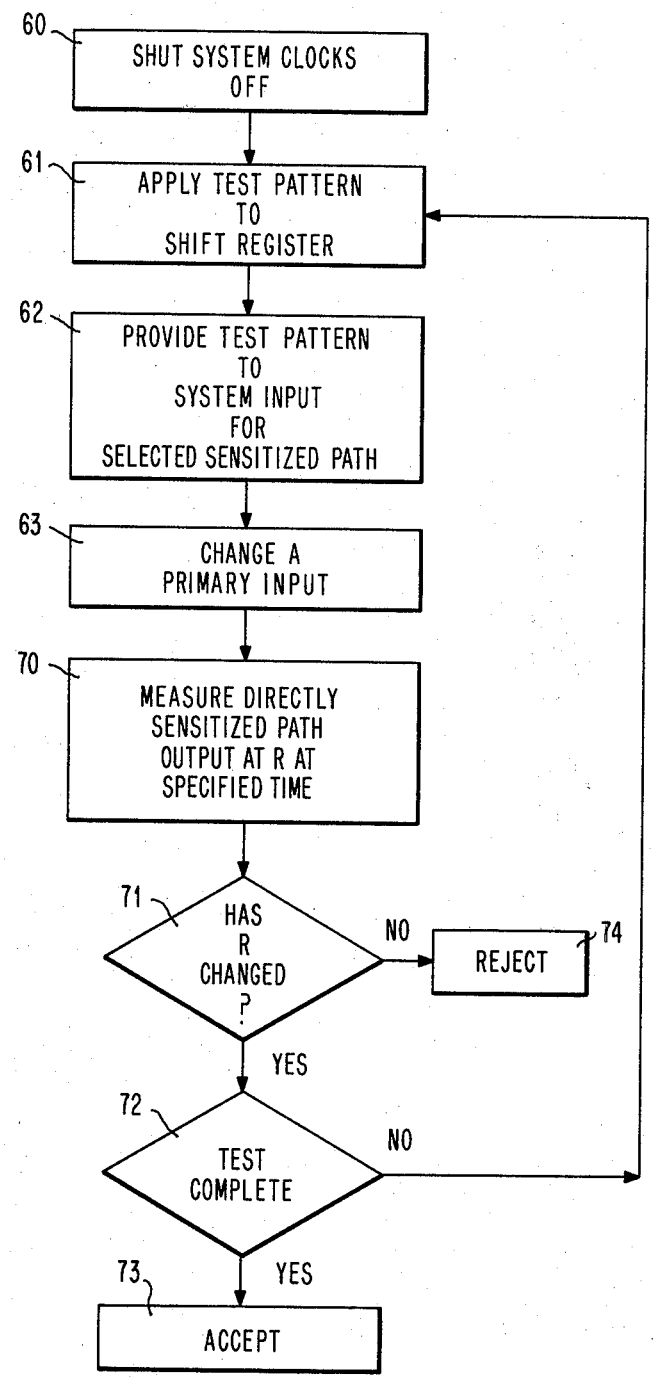
FIG. 19 is a flow diagram in greater detail of the steps in carrying out a portion of the propagation delay testing method when the measurement is made directly.

As previously noted, there are four general types of paths that must be sensitized in carrying out the method of the invention in determining propagation delays. One such path is from a primary input to a primary output. With reference to FIG. 7, this path runs from set S of system input signals through combinational network 38 to set R of system responses. To effect the change in a primary input, one of the system inputs is altered and the measurement of a change is performed according to a more detailed implementation of the measuring portion of the method of the invention, as shown in FIG. 19. After a predetermined period of time has elapsed, which is related to an acceptable propagation delay, the measurement is made directly at the output of the sensitized path, as in block 70. Interrogation is made at 71 to determine if at least one of the set R of system responses has changed. If it has not changed, the unit is rejected at 74. On the other hand, the interrogation continues to determine if the testing is complete as in block 72. If it is not, additional test patterns are sequentially supplied according to the method of the invention. When the testing is complete and all of the measurements for all of the test patterns have indicated a change, then the unit under test is accepted at 73.

The measuring steps involved where the sensitized path is from a set of latches to a primary output is performed in the same manner. Such a path would begin in one of the circuits in latch set 33, pass through combinational network 38 to the set R of system responses. In carrying out the propagation delay test on this type of sensitized path, the required test pattern is used to initialize the states of the latch circuits in latch sets 33, 34, and the required pattern is provided to set S of primary inputs. In addition, inputs are applied to combinational network 30 from set S and the output of latch set 34 to assure that the desired changes occur in latch set 33. Testing then occurs by raising and lowering the C1 clock train. This causes one of the latch circuits in latch set 33 to change state. The change is propagated through combinational network 38 to system responses R. Measurement is made according to the method of FIG. 19 directly at the output of the sensitized path.

The measurement occurs after a period of time has elapsed between raising the C1 clock train line to determine, as required in block 70, if a change in R has occurred. The particular elapsed time is the specified acceptable delay for such a path. Dependent upon the outcome of the interrogation as to a change in block 71, the method continues in the same manner as described when the sensitized path is from a primary input to a primary output. Similar steps are employed for sensitized paths from the latch circuits of latch set 34 to the system responses.

Figure 20:
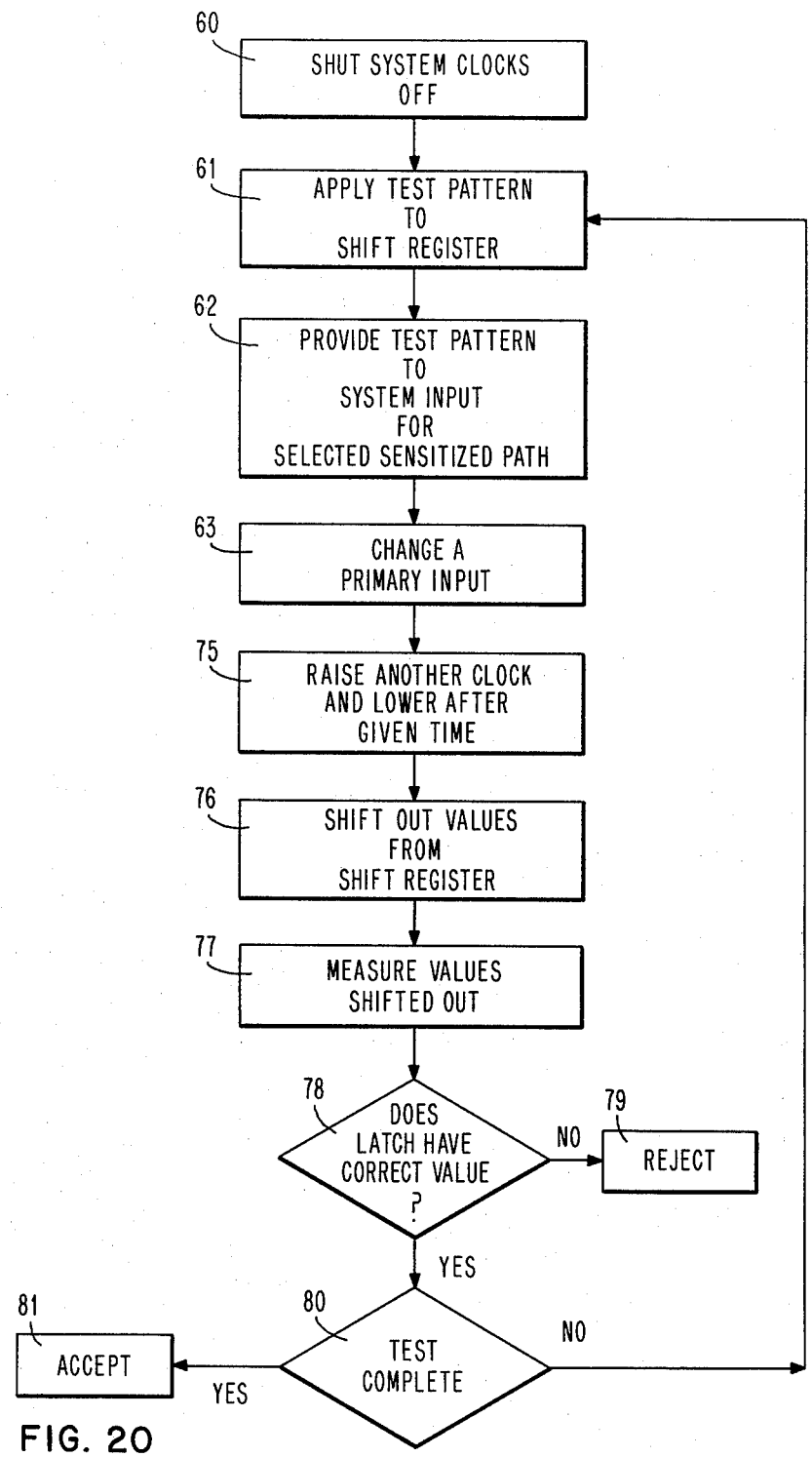
FIG. 20 is a flow diagram in greater detail of the steps in carrying out the method of propagation delay testing when the measurement is made after scan-out.

The other two general types of sensitized paths through a functional logic unit terminates in a set of latches. The measuring is performed by gating in the signals provided by a combination network into a set of latches and then employing the independent scan access and controls of the system of FIG. 7 for scanning out the state of the latch sets. In this manner, it is determined if the inputs to the latch set had changed to their new values prior to the turning off of the system clock. The steps of the method for this type of sensitized path are shown in FIG. 20.

One such general path is from a primary input to a latch set, such as from set S through combinational network 30 to latch set 33. The test for propagation delay through such a path is made by altering one of the primary inputs of set S (block 63). Thereafter, clock train C1 is exercised by raising and lowering it, as indicated in block 75 of FIG. 20. This gates any change in the output of network 30 into latch set 33.

To perform the measurement for a possible change, the state of the latch circuits in set 33 is shifted out using the shift controls, that is the clocks A and B. The state of these circuits appears on line 46 (block 76). The values appearing on line 46 are measured as in block 77 and interrogation is made at 78 to determine if a change occured in a latch circuit in a particular position to denote whether the propagation delay was less than the time between the change in the primary input and the fall of the clock train C1.

The interrogation made in block 78 provides an indication of a change. If no change occurred, the unit under test is rejected at 79. If a change did occur, interrogation is made at 80 to determine if the tests on the unit have been completed. If not, the testing continues as provided in block 61. Otherwise, the unit is accepted (block 81).

The fourth general type of sensitized path runs from a latch set through a combinational network to a second latch set, such as from the upper latch of latch set 34 through combinational network 30 to latch set 33. The appropriate inputs are applied to combinational network 30 from the set S of primary inputs and also from the inputs derived from latch set 34, after latch sets 33 and 34 have been initialized using the independent scan access and controls. In addition, appropriate test pattern inputs are applied to combinational networks 31 and 32 from set S of primary inputs and from the latch set 33 to assure the desired change in latch 34.

Testing for the propagation delay through this sensitized path is then performed by raising and lowering the C2 clock train line. After a predetermined elapsed time, the C1 clock train line is raised and thereafter lowered. If the change that occurred in one of the latch circuits of latch set 34 has reached a circuit in latch set 33 by the time clock train C2 is lowered, a new state will exist for this circuit in latch set 33. This state can then be shifted out as provided in block 76 of FIG. 20 for measurement at 77 when it appears on line 46. A determination can then be made whether the delay through the sensitized path is acceptable.

The method described above is employed for testing propagation delays through sensitized paths involving combinational logic networks. The delays of the latches are tested by applying minimum duration clock pulses at the C1 and C2. In this manner, any path that can be exercised during normal operation of such a generalized logic system can be sensitized and tested according to this method. The method involves the setting up of the latch sets with predetermined patterns in the circuits of the sets. Thereafter, a primary input is altered. Dependent on the particular path, this alteration involves the changing of one of the set S of primary inputs or one of the clock train inputs. Thereafter, following a predetermined period of elapsed time, measurement is made for a change at the output of the sensitized path, either directly or by clocking and gating the signals into a latch set and thereafter scanning out from this latch set for observation. The method, therefore, provides a substantial indication as to the dynamic performance of a functional logic unit.

While the invention has been particularly shown and described with reference to the preferred embodiments thereof, it will be understood by those skilled in the art that the foregoing and other changes in form and detail may be made therein without departing from the spirit and scope of the invention.

Having thus described our invention, what we claim as new, and desire to secure by Letters Patent is:

1. A system of logic for performing at least one predetermined logical function, said system of logic including:
    a plurality of combinational logic circuits;
    a multi-stage shift register having an input, an output, and shift controls;
    each stage of said multi-stage shift register comprising first and second interconnected DC latches;
    and circuit means interconnecting said plurality of combinational logic circuits and said first and second interconnected D.C. latches of said multi-stage shift register, whereby said shift register is available for use in the testing of each of said plurality of combinational logic circuits and each of said D.C. latches of said multi-stage shift register is also available for use as an independently operable data latch in providing said at least one predetermined logical function.

2. A system of logic for performing at least one predetermined logical function, as recited in claim 1 further characterized in that at least certain of said D.C. latches of said multi-stage shift register are comprised of the following circuitry (FIG. 9B):
    first, second, third, fourth, seventh, eighth, ninth and tenth AND-INVERT circuits each having first and second inputs and an output;
    fifth, sixth, eleventh and twelfth AND-INVERT circuits each having first, second and third inputs and an output;
    a first inverter circuit (41) having its input connected to said first input of said first AND-INVERT circuit (39) and its output connected to said first input of said second AND-INVERT (40) circuit;
    a second inverter circuit having its input connected to said first input of said third AND-INVERT circuit and its output connected to said first input of said fourth AND-INVERT circuit;
    a third inverter circuit (47) having its input connected to the first input of said ninth AND-INVERT circuit (45) and its output connected to said first input of said tenth AND-INVERT circuit (46);
    an input U connected to said first input of said first AND-INVERT circuit (39);
    a clock source A connected in common to said second inputs of said first and second AND-INVERT circuit (39, 49);
    an input E1 connected to said first input of said third AND-INVERT circuit;
    a clock source C1 connected in common to said second inputs of said third and fourth AND-INVERT CIRCUITS:
    an input E2 connected to said first input of said ninth AND-INVERT circuit;
    a clock source C2 connected in common to said second input of said ninth and tenth AND-INVERT circuits (45, 46);
    a direct connection between said output of said first AND-INVERT circuit (39) and said first input of said fifth AND-INVERT circuit;
    a direct connection between said output of said third AND-INVERT circuit and said second input of said fifth AND-INVERT circuit;
    a direct connection between said output of said fourth AND-INVERT circuit and said second input of said sixth AND-INVERT circuit;
    a direct connection between said output of said second AND-INVERT circuit (40) and said third input of said sixth AND-INVERT circuit;
    an output terminal L connected to said output of said fifth AND-INVERT circuit;
    a direct connection connecting in common said output of said fifth AND-INVERT circuit, said first input of said sixth AND-INVERT circuit and said first input of said seventh AND-INVERT circuit (43);
    a direct connection connecting in common said output of said sixth AND-INVERT circuit, said third input of said fifth AND-INVERT circuit and said first input of said eighth AND-INVERT circuit (44);
    a clock source B connected in common to said second inputs of said seventh and eighth AND-INVERT circuit (43, 44);
    a direct connection between said output of said seventh AND-INVERT circuit (43) and said first input of said eleventh AND-INVERT circuit;
    a direct connection between said output of said ninth AND-INVERT circuit (45) and said second input of said eleventh AND-INVERT circuit;
    a direct connection between said output of said eighth AND-INVERT circuit (44) and said third input of said twelfth AND-INVERT circuit;
    a direct connection between said output of said tenth AND-INVERT circuit (46) and said second input of said twelth AND-INVERT circuit;
    a direct connection between said output of said eleventh AND-INVERT circuit and said first input of said twelfth AND-INVERT circuit;
    a direct connection between said output of said twelfth AND-INVERT circuit and said third input of said eleventh AND-INVERT circuit;

and, an output V connected to said output of said eleventh AND-INVERT circuit.

3. A multi-stage shift register characterized in that at least certain of said stages of said multi-stage shift register are comprised of the following circuitry (FIG. 9B):

first, second, third, fourth, seventh, eighth, ninth and tenth AND-INVERT circuits each having first and second inputs and an output;

fifth, sixth, eleventh and twelfth AND-INVERT circuits each having first, second and third inputs and an output;

a first inverter circuit (41) having its input connected to said first input of said first AND-INVERT circuit (39) and its output connected to said first input of said second AND-INVERT (40) circuit;

a second inverter circuit having its input connected to said first input of said third AND-INVERT circuit and its output connected to said first input of said fourth AND-INVERT circuit;

a third inverter circuit (47) having its input connected to the first input of said ninth AND-INVERT circuit (45) and its output connected to said first input of said tenth AND-INVERT circuit (46);

an input U connected to said first input of said first AND-INVERT circuit (39);

a clock source A connected in common to said second inputs of said first and second AND-INVERT circuit (39, 40);

an input E1 connected to said first input of said third AND-INVERT circuit;

a clock source C1 connected in common to said second inputs of said third and fourth AND-INVERT CIRCUITS:

an input E2 connected to said first input of said ninth AND-INVERT circuit;

a clock source C2 connected in common to said second input of said ninth and tenth AND-INVERT circuits (45, 46);

a direct connection between said output of said first AND-INVERT circuit (39) and said first input of said fifth AND-INVERT circuit;

a direct connection between said output of said third AND-INVERT circuit and said second input of said fifth AND-INVERT circuit;

a direct connection between said output of said fourth AND-INVERT circuit and said second input of said sixth AND-INVERT circuit;

a direct connection between said output of said second AND-INVERT circuit (40) and said third input of said sixth AND-INVERT circuit;

an output terminal L connected to said output of said fifth AND-INVERT circuit;

a direct connection connecting in common said output of said fifth AND-INVERT circuit, said first input of said sixth AND-INVERT circuit and said first input of said seventh AND-INVERT circuit (43);

a direct connection connecting in common said output of said sixth AND-INVERT circuit, said third input of said fifth AND-INVERT circuit and said first input of said eighth AND-INVERT circuit (44);

a clock source B connected in common to said second inputs of said seventh and eighth AND-INVERT circuit (43, 44);

a direct connection between said output of said seventh AND-INVERT circuit (43) and said first input of said eleventh AND-INVERT circuit;

a direct connection between said output of said ninth AND-INVERT circuit (45) and said second input of said eleventh AND-INVERT circuit;

a direct connection between said output of said eighth AND-INVERT circuit (44) and said third input of said twelfth AND-INVERT circuit;

a direct connection between said output of said tenth AND-INVERT circuit (46) and said second input of said twelfth AND-INVERT circuit;

a direct connection between said output of said eleventh AND-INVERT circuit and said first input of said twelfth AND-INVERT circuit;

a direct connection between said output of said twelfth AND-INVERT circuit and said third input of said eleventh AND-INVERT circuit;

and, an output V connected to said output of said eleventh AND-INVERT circuit.

* * * * *